United States Patent
Nomura et al.

(10) Patent No.: US 9,638,767 B2
(45) Date of Patent: May 2, 2017

(54) CURRENT SENSOR AND ATTACHMENT STRUCTURE OF THE SAME

(75) Inventors: Kousuke Nomura, Nagoya (JP); Norihiro Kurumado, Nagoya (JP)

(73) Assignee: DENSO CORPORATION, Kariya (JP)

( * ) Notice: Subject to any disclaimer, the term of this patent is extended or adjusted under 35 U.S.C. 154(b) by 767 days.

(21) Appl. No.: 13/613,835

(22) Filed: Sep. 13, 2012

(65) Prior Publication Data

US 2013/0073238 A1    Mar. 21, 2013

(30) Foreign Application Priority Data

Sep. 19, 2011 (JP) ................. 2011-203969

(51) Int. Cl.
*G01R 33/09*    (2006.01)
*G06F 19/00*    (2011.01)

(52) U.S. Cl.
CPC .................... *G01R 33/09* (2013.01)

(58) Field of Classification Search
CPC ..................................................... G01R 33/09
USPC ............ 702/64; 324/117 R, 25.2, 207.2, 252
See application file for complete search history.

(56) References Cited

U.S. PATENT DOCUMENTS

| | | | |
|---|---|---|---|
| 2005/0030004 A1* | 2/2005 | Takatsuka et al. | 324/117 H |
| 2005/0237049 A1 | 10/2005 | Ozaki et al. | |
| 2007/0188946 A1* | 8/2007 | Shoji | 360/324.12 |
| 2008/0116886 A1 | 5/2008 | Yamada et al. | |
| 2011/0285384 A1* | 11/2011 | Nomura | 324/117 R |

FOREIGN PATENT DOCUMENTS

| | | |
|---|---|---|
| JP | A-2000-55997 | 2/2000 |
| JP | A-2005-49184 | 2/2005 |
| JP | A-2007-78416 | 3/2007 |
| JP | A-2007-155399 | 6/2007 |
| JP | A-2010-286270 | 12/2010 |
| JP | 2011-089931 A | 5/2011 |

OTHER PUBLICATIONS

Office action mailed Sep. 2, 2014 in the corresponding CN application No. 201210350482.4 (English translation).
Office action mailed Oct. 1, 2013 in the corresponding JP application No. 2011-203969 (English translation).

* cited by examiner

*Primary Examiner* — John Breene
*Assistant Examiner* — Yaritza H Perez Bermudez
(74) *Attorney, Agent, or Firm* — Posz Law Group, PLC

(57) ABSTRACT

In a current sensor for detecting an electric current flowing in a current path, a magnetic field generating element generates a second magnetic field perpendicular to a first magnetic field generated by the electric current of the current path, and a magnetic sensor generates at least one of a first signal containing a sine value according to an angle defined between the second magnetic field and a synthetic magnetic field composed of the first magnetic field and the second magnetic field and a second signal containing a cosine value according to the angle. A signal processing unit includes a calculation circuit that calculates a tangential value according to the angle using the at least one of the first signal and the second signal, and outputs a sensor signal containing the tangential value.

22 Claims, 13 Drawing Sheets

CURRENT SENSOR AND ATTACHMENT STRUCTURE OF THE SAME

CROSS REFERENCE TO RELATED APPLICATION

This application is based on Japanese Patent Application No. 2011-203969 filed on Sep. 19, 2011, the disclosure of which is incorporated herein by reference.

TECHNICAL FIELD

The present disclosure relates to a current sensor that includes a magnetic sensor having a magnetoresistive element, and an attachment structure of the current sensor.

BACKGROUND

For example, JP2007-155399A describes a current sensor that includes a bias magnet generating a bias magnetic field and a magnetic sensor having a magnetoresistive element whose resistance value changes according to a magnetic field applied thereto.

Such a current sensor is arranged relative to a current path, such as a bus bar, such that a direction of the bias magnetic field is parallel to a direction of an electric current flowing in the current path to detect the electric current (hereinafter also referred to as the detection current). As the detection current flows in the current path, a current magnetic field is generated in a direction perpendicular to the bias magnetic field. The current magnetic field is proportional to a magnitude of the detection current. As such, the current sensor is applied with a synthetic magnetic field composed of the bias magnetic field and the current magnetic field. Since the resistance value of the magnetoresistive element changes according to the synthetic magnetic field, the current sensor outputs a sensor signal according to the synthetic magnetic field.

As examples of the magnetoresistive element, generally, an anisotropic magnetoresistive (AMR) element, a giant magnetoresistive (GMR) element, and a tunnel magnetoresistive (TMR) element are known. With regard to the anisotropic magnetoresistive element, a resistance value changes in the form of second harmonic of a sine wave or second harmonic of a cosine wave according to an angle of the synthetic magnetic field applied thereto. With regard to the giant magnetoresistive element and the tunnel magnetoresistive element, a resistance value changes in the form of a sine wave or a cosine wave according to an angle of the synthetic magnetic field applied thereto. Therefore, a current sensor having these magnetoresistive elements outputs a sensor signal containing a sine value or a sensor signal containing a cosine value.

However, the sensor signal containing the sine value and the signal the cosine value according to the angle of synthetic magnetic field are not outputted linearly with respect to the detection current. Therefore, detection accuracy varies according to the detection current. In other words, in an area where linearity of the sensor signal outputted is high, the detection accuracy is high. However, in an area where the linearity of the sensor signal outputted is low, the detection accuracy is low. Here, the linearity of the sensor signal outputted, that is, linear output means output in which the detection current and the sensor signal (voltage) have a proportional relationship with respect to each other.

SUMMARY

It is an object of the present disclosure to provide a current sensor capable of outputting a sensor signal that has a linear relationship with respect to a detection current flowing in a current path and improving detection accuracy. It is another object of the present disclosure to provide an attachment structure of the current sensor.

According to an aspect of the present disclosure, a current sensor includes a magnetic field generating element, a magnetic sensor and a signal processing unit. The magnetic field generating element generates a second magnetic field perpendicular to a first magnetic field generated by an electric current flowing in a current path. The magnetic sensor includes a magnetoresistive element made of a pin layer, a tunnel layer and a free layer. The pin layer has a fixed magnetization direction. The tunnel layer is provided by an insulating member and is disposed between the pin layer and the free layer. The free layer has a property where a magnetization direction changes according to an external magnetic field. The magnetic sensor generates at least one of a first signal containing a sine value according to an angle defined between the second magnetic field and a synthetic magnetic field composed of the first magnetic field and the second magnetic field and a second signal containing a cosine value according to the angle defined between the second magnetic field and the synthetic magnetic field. The signal processing unit receives the at least one of the first signal and the second signal. The signal processing unit includes a calculation circuit. The calculation circuit calculates a tangential value according to the angle defined between the second magnetic field and the synthetic magnetic field using the at least one of the first signal and the second signal, and outputs a sensor signal containing the tangential value.

In the above structure, the calculation circuit calculates the tangential value of the angle defined between the second magnetic field and the synthetic magnetic field, and outputs the sensor signal containing the tangential value. Namely, the calculation circuit performs division of the first magnetic field by the second magnetic field, and outputs the sensor signal that is proportional to the first magnetic field. Accordingly, the sensor signal has a property that changes linearly with respect to the detection current, and hence detection accuracy improves.

For example, the current sensor is attached to the current path such that the second magnetic field is parallel to a direction of the electric current flowing in the current path.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION (First Embodiment)

A first embodiment of the present disclosure will be hereinafter described with reference to FIGS. 1 through 5.

A current sensor according to the first embodiment is, for example, used to detect an electric current (hereinafter also referred to as the detection current) flowing in a bus bar that is connected to an in-vehicle battery or the like.

Figure 1:
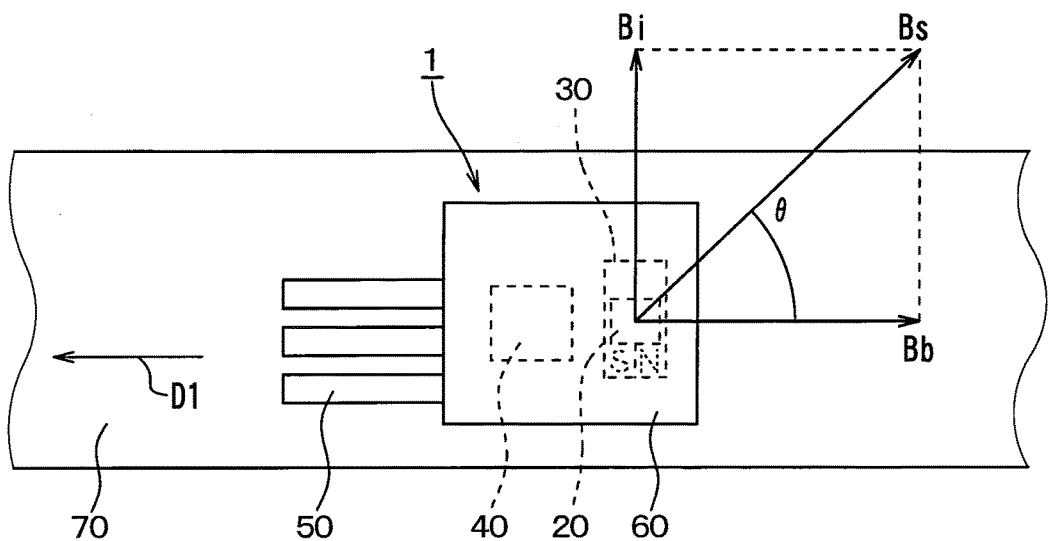
FIG. 1 is a diagram illustrating a schematic structure of a current sensor attached to a bus bar, according to a first embodiment of the present disclosure.
Figure 2:
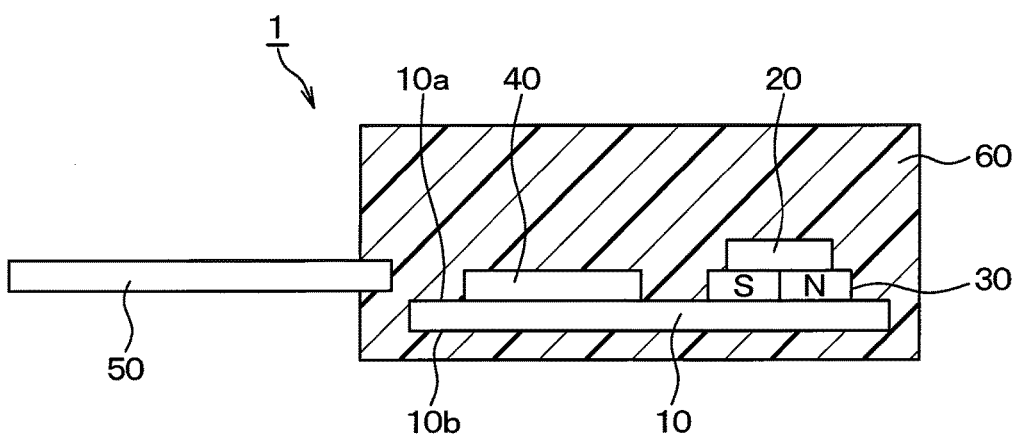
FIG. 2 is a diagram illustrating a schematic sectional view of the current sensor shown in FIG. 1.

Referring to FIGS. 1 and 2, a current sensor 1 includes a substrate 10, a magnetic sensor 20, a bias magnet 30, a circuit chip 40, leads 50 and a molded resin 60. The substrate 10 has a first surface 10a and a second surface 10b opposite to the first surface 10a. The magnetic sensor 20, the bias magnet 30 and the circuit chip 40 are disposed on the first surface 10a of the substrate 10. The magnetic sensor 20 has a substantially rectangular outline and includes a magnetoresistive element. The bias magnet 30 has a substantially rectangular outline, and applies a bias magnetic field Bb to the magnetic sensor 20. The circuit chip 40 performs calculation using a signal outputted from the magnetic sensor 20.

In the present embodiment, the bias magnet 30 corresponds to a magnetic field generating element, and the circuit chip 40 corresponds to a signal processing unit. Also, the bias magnetic field Bb corresponds to a second magnetic field.

The bias magnet 30 is disposed on the first surface 10a of the substrate 10, and the magnetic sensor 20 is disposed on the bias magnet 30. In other words, the magnetic sensor 20 is disposed on the first surface 10a of the substrate 10 through the bias magnet 30. This arrangement restricts the bias magnetic field Bb from being partially unevenly applied to the magnetic sensor 20, as compared with an arrangement where the magnetic sensor 20 is arranged adjacent to a corner of the substantially rectangular bias magnet 30. Namely, the magnetic sensor 20 includes multiple magnetoresistive elements, as will be described later in detail. This arrangement reduces unevenness of an angle of the bias magnetic field Bb affecting to each of the multiple magnetoresistive elements.

The substrate 10, the magnetic sensor 20, the bias magnet 30, the circuit chip 40 and the leads 50 are sealed with the molded resin 60 and configured as a molded IC. The leads 50 are electrically connected to the circuit chip 40 through wires (not shown). Ends of the leads 50, opposite to the substrate 10, project outward of the molded resin 60, and provide outer leads.

The current sensor 1 having the configuration described above is attached to the bus bar 70, as shown in FIG. 1, to detect the electric current flowing in the bus bar 70. The bus bar 70 corresponds to a current path through which the electric current flows.

The current sensor 1 is attached to the bus bar 70 such that a direction of the bias magnetic field Bb is parallel to a direction of the electric current flowing in the bus bar 70. In other words, the current sensor 1 is attached to the bus bar 70 such that the direction of the bias magnetic field Bb and a direction of a current magnetic field Bi generated by the electric current flowing in the bus bar 70 are perpendicular to each other. Thus, the magnetic sensor 20 is applied with a synthetic magnetic field Bs made of the bias magnetic field Bb and the current magnetic field Bi. In FIG. 1, an arrow D1 denotes the direction of the electric current flowing in the bus bar 70. In the present embodiment, the current magnetic field Bi corresponds to a first magnetic field.

Next, a circuit structure of the current sensor 1 will be described.

Figure 3:
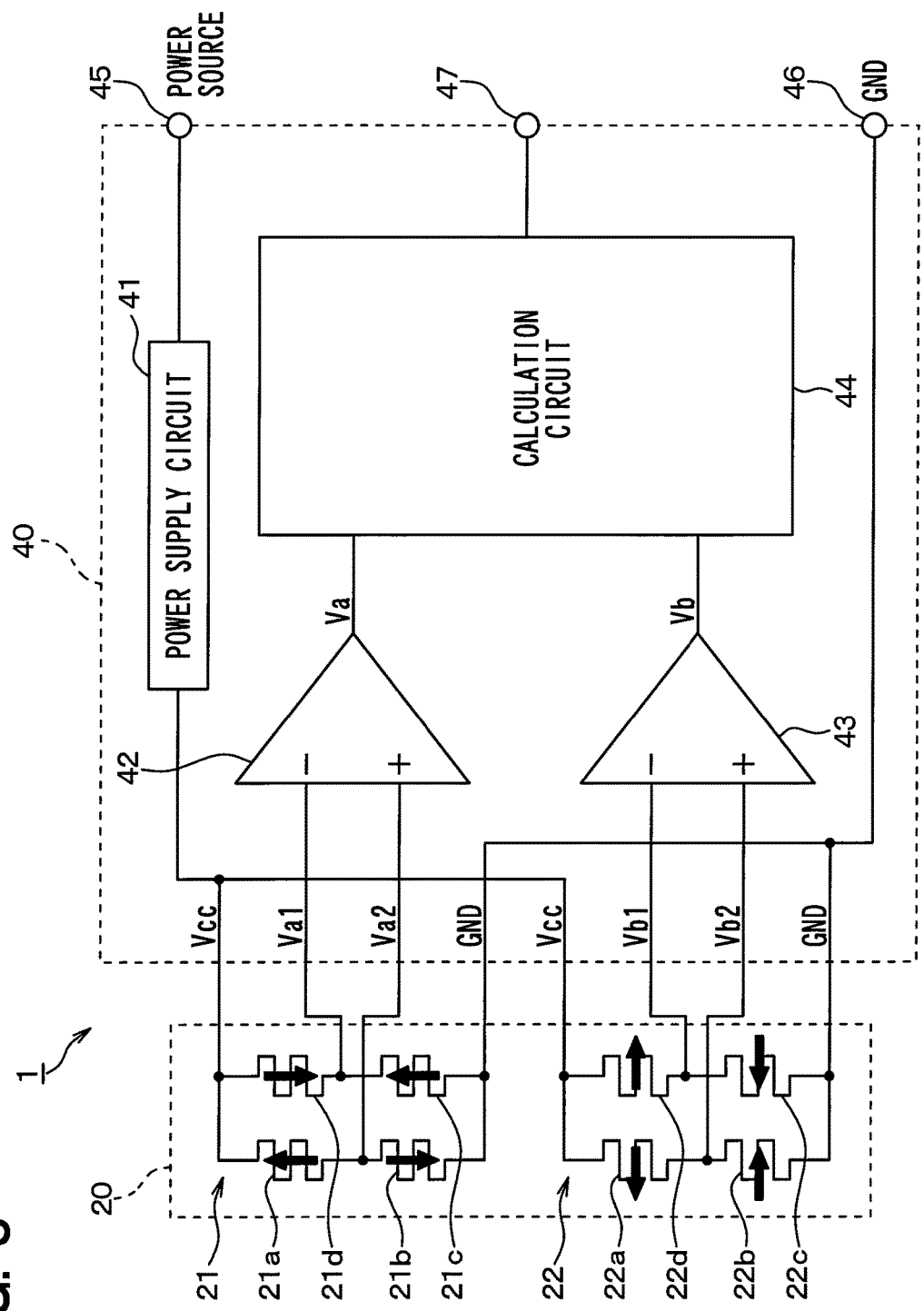
FIG. 3 is a schematic circuit diagram of the current sensor shown in FIG. 1.
Figure 4:
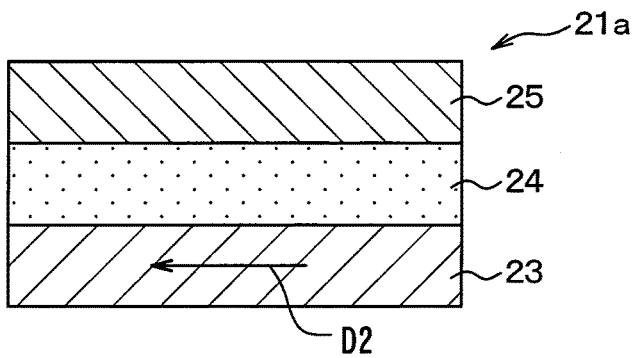
FIG. 4 is a diagram illustrating a schematic sectional view of a magnetoresistive element of a magnetic sensor of the current sensor according to the first embodiment.

As shown in FIG. 3, the magnetic sensor 20 includes a first detection unit 21 and a second detection unit 22. The first detection unit 21 includes four magnetoresistive elements 21a to 21d that are configured to form a bridge circuit. The second detection unit 22 includes four magnetoresistive elements 22a to 22d that are configured to form a bridge circuit. FIG. 4 is a diagram illustrating a sectional view of the magnetoresistive element 21a as an example.

As shown in FIG. 4, the magnetoresistive element 21a includes a pin layer 23 whose a magnetization direction is fixed to a predetermined direction, a tunnel layer 24 made of an insulating material, and a free layer 25 whose a magnetization direction varies according to an external magnetic force. The pin layer 23, the tunnel layer 24 and the free layer 25 are stacked such that the tunnel layer 24 is located between the pin layer 23 and the free layer 25. Although not illustrated, the magnetoresistive element 21a further includes a lower electrode and an upper electrode. In FIG. 4, the magnetization direction of the pin layer 23 is shown by an arrow D2.

The magnetoresistive elements 21b to 22d have the similar structure to the magnetoresistive element 21a. The magnetoresistive elements 22a to 22d have the similar structure to the magnetoresistive element 21a, but the magnetization direction of the pin layer 23 of the magnetoresistive elements 22a to 22d is perpendicular to the magnetization direction of the pin layer 23 of the magnetoresistive element 21a.

In other words, in the first detection unit 21, the magnetization directions of the pin layers 23 of the magnetoresistive elements 21a to 21d are parallel to each other. Further, the magnetization direction of the pin layer 23 of each of the magnetoresistive elements 22a to 22d of the second detection unit 22 is perpendicular to the magnetization direction of the pin layer 23 of each of the magnetoresistive elements 21a to 21d of the first detection unit 21. In FIG. 3, a solid arrow denotes the magnetization direction of each of the magnetoresistive elements 21a to 21d and 22a to 22d.

The magnetic sensor 20 is disposed on the first surface 10a of the substrate 10 such that the magnetization direction of the first detection unit 21 is perpendicular to the bias magnetic field Bb and the magnetization direction of the second detection unit 22 is parallel to the bias magnetic field Bb. As shown in FIG. 1, therefore, when an angle defined between the bias magnetic field Bb and the synthetic magnetic field Bs is defined as θ, the first detection unit 21 outputs signals Va1, Va2 each containing sin θ, and the second detection unit 22 outputs signals Vb1, Vb2 each containing cos θ Here, the signal containing the sin θ corresponds to a first signal containing a sine value according to the angle θ, and the signal containing the cos θ corresponds to a second signal containing a cosine value according to the angle θ.

The circuit chip 40 includes a power supply circuit 41, a first differential amplifying circuit 42, a second differential amplifying circuit 43, and a calculation circuit 44.

The power supply circuit 41 includes a constant voltage circuit and the like. The power supply circuit 41 is connected to a midpoint between the magnetoresistive element 21a and the magnetoresistive element 21d of the first detection unit 21 as well as to a midpoint between the magnetoresistive element 22a and the magnetoresistive element 22d of the second detection unit 22.

The power supply circuit 41 converts a voltage supplied from a power source through a terminal 45 into a constant voltage Vcc, and applies the constant voltage Vcc to the midpoint between the magnetoresistive element 21a and the magnetoresistive element 21d of the first detection unit 21 and the midpoint between the magnetoresistive element 22a and the magnetoresistive element 22d of the second detection unit 22.

A midpoint between the magnetoresistive element 21b and the magnetoresistive element 21c of the first detection unit 21 is connected to a ground through the terminal 46. Also, a midpoint between the magnetoresistive element 22b and the magnetoresistive element 22c of the second detection unit 22 is connected to the ground through the terminal 46.

The first differential amplifying circuit 42 is connected to the first detection unit 21. Specifically, an inverting input terminal of the first differential amplifying circuit 42 is connected to a midpoint between the magnetoresistive element 21c and the magnetoresistive element 21d to receive a voltage Va1 at the midpoint. A non-inverting input terminal of the first differential amplifying circuit 42 is connected to a midpoint between the magnetoresistive element 21a and the magnetoresistive element 21b to receive a voltage Va2 at the midpoint.

The first differential amplifying circuit 42 amplifies a difference between the voltage Va1 and the voltage Va2 and outputs a signal Va to the calculation circuit 44. As signals containing sin θ are provided from the first detection unit 21 to the first differential amplifying circuit 42 as the voltages Va1, Va2, the signal Va is expressed as the following formula 1.

$$Va = G(Va2 - Va1) = G \cdot Vcc \cdot K(t) \cdot \sin \theta \qquad \text{[Formula 1]}$$

In the formula 1, G denotes an amplification factor of the first differential amplifying circuit 42, Vcc denotes the voltage applied to the first detection unit 21, k(t) denotes a temperature characteristic of the first detection unit 21.

The second differential amplifying circuit 43 is connected to the second detection unit 22. The second differential amplifying circuit 43 has the similar structure to the first differential amplifying circuit 42. An inverting input terminal of the second differential amplifying circuit 43 is connected to a midpoint between the magnetoresistive element 22c and the magnetoresistive element 22d to receive a voltage Vb1 at the midpoint. A non-inverting input terminal of the second differential amplifying circuit 43 is connected to a midpoint between the magnetoresistive element 22a and the magnetoresistive element 22b to receive a voltage Vb2 at the midpoint.

The second differential amplifying circuit 43 amplifies a difference between the voltage Vb1 and the voltage Vb2 and outputs a signal Vb to the calculation circuit 44. As signals containing cos θ are provided from the second detection unit 22 to the second differential amplifying circuit 43 as the voltages Vb1, Vb2, the signal Vb is expressed as the following formula 2.

$$Vb = G(Vb2 - Vb1) = G \cdot Vcc \cdot K(t) \cdot \cos \theta \qquad \text{[Formula 2]}$$

In the formula 2, G denotes an amplification factor of the second differential amplifying circuit 43, Vcc denotes the voltage applied to the second detection unit 22, k(t) denotes a temperature characteristic of the second detection unit 22.

Since the first differential amplifying circuit 42 and the second differential amplifying circuit 43 have the similar structure, the amplification factor G is the same value between the first differential amplifying circuit 42 and the second differential amplifying circuit 43. Further, the magnetoresistive elements 21a to 21d of the first detection unit 21 and the magnetoresistive elements 22a to 22d of the second detection unit 22 have the similar structure except for the magnetization directions thereof. Therefore, the temperature characteristic k(t) is the same value between the first detection unit 21 and the second detection unit 22.

The calculation circuit 44 calculates a tangential value according to the angle θ, which is defined between the bias magnetic field Bb and the synthetic magnetic field Bs, using the signals Va, Vb outputted from the first and second differential amplifying circuits 42, 43. The calculation circuit 44 outputs a signal according to the tangential value as a sensor signal from a terminal 47.

Specifically, the calculation circuit 44 receives the signal Va expressed by the formula 1 from the first differential amplifying circuit 42 and the signal Vb expressed by the formula 2 from the second differential amplifying circuit 43. The calculation circuit 44 calculates the tangential value (tan θ) by dividing the signal Va by the signal Vb. The calculation circuit 44 outputs a signal corresponding to a calculation result as the sensor signal.

In other words, as shown in FIG. 1, the tangential value is obtained by dividing the current magnetic field Bi (sometimes referred to as the "first magnetic field") by the bias magnetic field Bb (sometimes referred to as the "second magnetic field") (i.e., tan α=Bi/Bb). Therefore, the calculation circuit 44 outputs the signal corresponding to Bi/Bb as the sensor signal. That is, the bias magnetic field Bb (sometimes referred to as the "second magnetic field") is provided by the bias magnet 30, and is constant. Therefore, the calculation circuit 44 outputs the signal proportional to the current magnetic field Bi (sometimes referred to as the "first magnetic field"), which is generated by the detection current flowing in the bus bar 70, as the sensor signal. Accordingly, the sensor signal is a signal that varies linearly with respect to the detection current (sometimes referred to as the "electric current") flowing in the bus bar 70.

Figure 5:
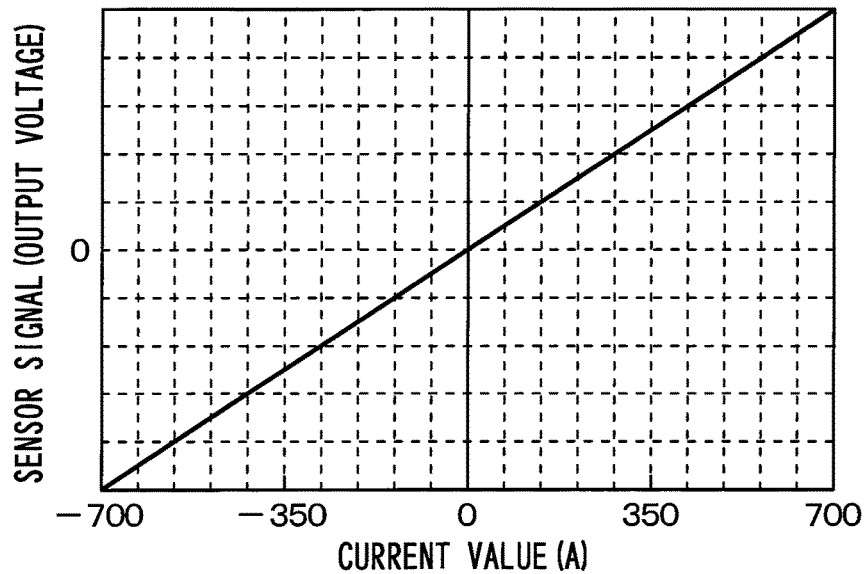
FIG. 5 is a graph illustrating a relationship (shown as linearly proportional) between a detection current (sometimes referred to as the "electric current") flowing in the bus bar and a sensor signal, according to the first embodiment.

FIG. 5 is a graph illustrating a relationship between the detection current flowing in the bus bar 70 and the sensor signal. The angle θ defined between the bias magnetic field Bb and the synthetic magnetic field Bs increases proportional to the value of the detection current flowing in the bus bar 70. Therefore, as shown in FIG. 5, the sensor signal outputted from the calculation circuit 44 linearly corresponds to the detection current flowing in the bus bar 70. In other words, the sensor signal outputted from the calculation circuit 44 has a linear relationship with respect to the detection current flowing in the bus bar 70.

As described above, the calculation circuit 44 outputs the sensor signal corresponding to the tangential value. In this case, the calculation circuit 44 may output a value in which a predetermined offset is added to the tangential value calculated as the sensor signal or may output the tangential value itself as the sensor signal. In the present embodiment, for example, the calculation circuit 44 directly outputs the tangential value as the sensor signal. In other words, the sensor signal corresponding to the tangential value means a sensor signal containing the tangential value.

As described above, in the current sensor 1 according to the present embodiment, the calculation circuit 44 calculates the tangential value according to the angle θ defined by the bias magnetic field Bb and the synthetic magnetic field Bs using the signals Va, Vb provided from the first and second detection units 21, 22 through the first and second differential amplifying circuits 42, 43, and outputs the signal corresponding to the tangential value as the sensor signal.

Namely, the calculation circuit 44 performs the division of the current magnetic field Bi (sometimes referred to as the "first magnetic field") by the bias magnetic field Bb (sometimes referred to as the "second magnetic field") (i.e., Bi/Bb), and outputs the sensor signal that is proportional to the current magnetic field Bi. (sometimes referred to as the "first magnetic field"). Therefore, the sensor signal has the linear relationship (proportional relationship) with respect to the detection current. As such, variation of the detection accuracy depending on the magnitude of the detection current is reduced.

The current sensor 1 described above can be provided without requiring additional parts with respect to a conventional current sensor. Therefore, manufacturing costs of the current sensor 1 will not largely increase.

In addition, the calculation circuit 44 performs the division of the signal Va expressed by the formula 1 by the signal Vb expressed by the formula 2. Therefore, the temperature characteristic contained in the signals Va, Vb is cancelled. Accordingly, the current sensor 1 can output the sensor signal without having the temperature characteristic.

(Second Embodiment)

A second embodiment of the present disclosure will be hereinafter described.

Figure 6:
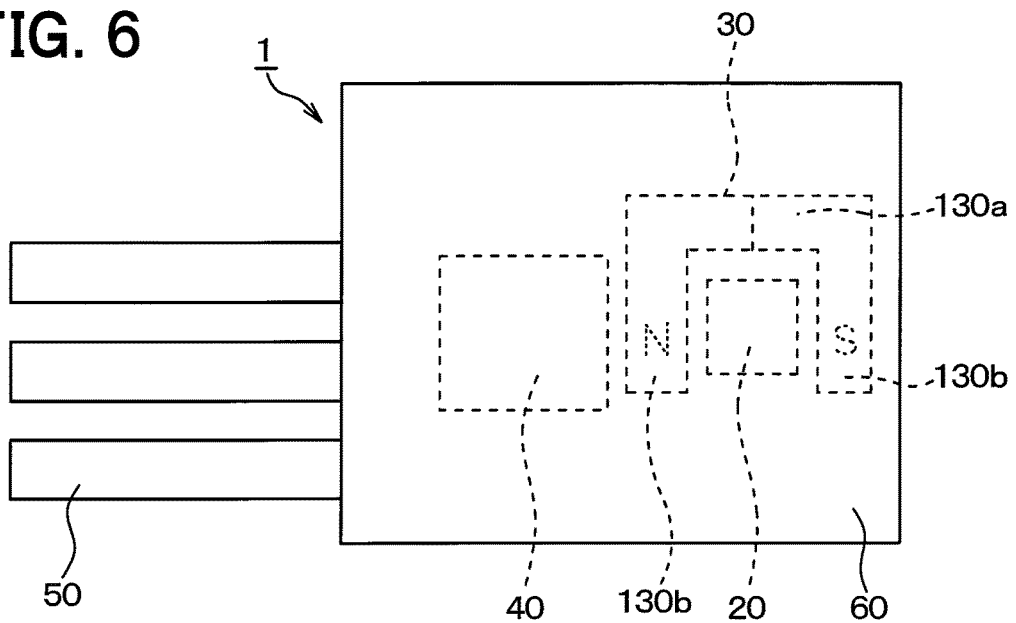
FIG. 6 is a diagram illustrating a schematic plan view of a current sensor according to a second embodiment of the present disclosure.

In a current sensor 1 according to the second embodiment, the bias magnet 30 has a shape different from that of the first embodiment. Other structures of the current sensor 1 of the second embodiment will be the same as the first embodiment, and a structure thereof will not be repeated. FIG. 6 is a diagram illustrating a schematic plan view of the current sensor 1 according to the second embodiment.

As shown in FIG. 6, the bias magnet 30 has a first part 130a and second parts 130b. The first part 130a extends in a predetermined direction, such as a direction parallel to the direction of the detection current flowing in the bus bar 70. The second parts 130b extend perpendicularly from opposite ends of the first part 130a. In other words, the bias magnet 30 has substantially a U-shape. The magnetic sensor 20 is disposed in a space defined by the bias magnet 30. In other words, the magnetic sensor 20 is disposed between the second parts 130b of the bias magnet 30.

In this case, the bias magnetic field Bb is generated in a direction from one of the second parts 130b defining a north pole to the other of the second parts 130b defining a south pole. Further, the magnetic sensor 20 is disposed between the second parts 130b. In this structure, it is less likely that the bias magnetic field Bb will be partly unevenly applied to the magnetic sensor 20, as compared with a structure in which the magnetic sensor 20 is disposed adjacent to a corner of a rectangular-shaped bias magnet.

(Third Embodiment)

A third embodiment of the present disclosure will be hereinafter described.

Figure 7:
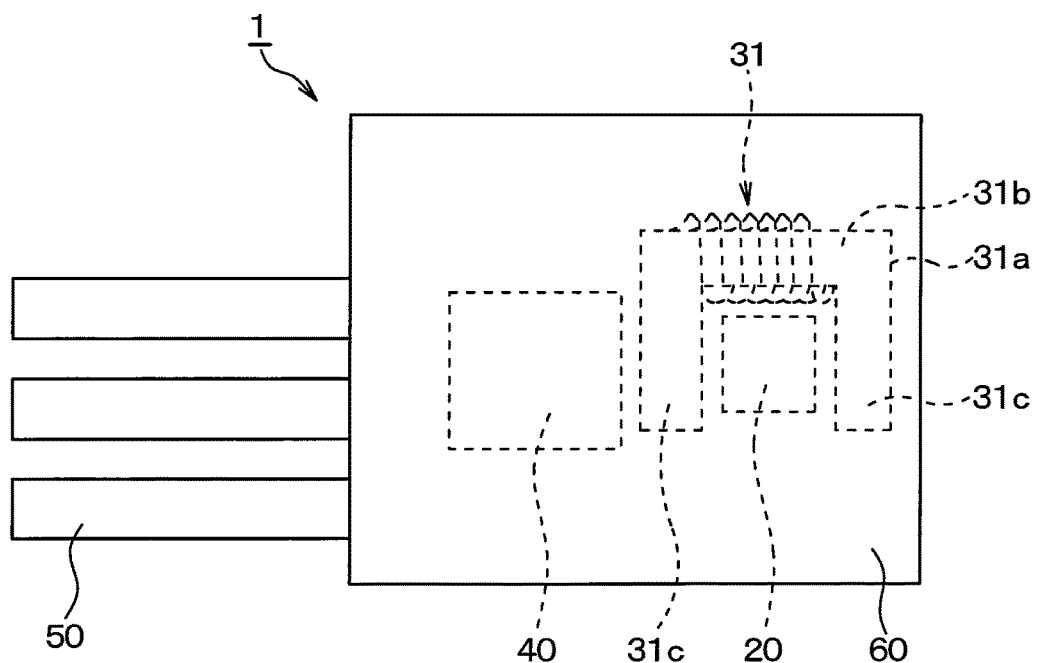
FIG. 7 is a diagram illustrating a schematic plan view of a current sensor according to a third embodiment of the present disclosure.

A current sensor 1 according to the third embodiment has a magnetic field generating element that is different from the first embodiment. Other structures of the third embodiment will be the same as the first embodiment, and a description thereof will not be repeated. FIG. 7 is a diagram illustrating a schematic plan view of the current sensor 1 according to the third embodiment.

As shown in FIG. 7, the current sensor 1 has a core coil 31 on the substrate 10, in place of the bias magnet 30. The core coil 31 is sealed with the molded resin 60. The core coil 31 includes a core 31a and a winding wound around the core 31a. The core 31a includes a first part 31b extending in one direction and second parts 31c extending perpendicularly from opposite ends of the first part 31b. The core 31a has substantially a U-shape. The winding is wound around the first part 31b of the core 31a. The winding is electrically connected to the circuit chip 40, and is supplied with a predetermined electric current from the circuit chip 40.

Namely, in the present embodiment, the bias magnetic field Bb is generated as the electric current is supplied to the core coil 31. The bias magnetic field Bb is applied to the magnetic sensor 20. Thus, the core coil 31 corresponds to the magnetic field generating element. When the electric current is supplied to the core coil 31, the bias magnetic field Bb is generated in a direction parallel to a left and right direction of FIG. 7. The magnetic sensor 20 is disposed in the space defined by the core coil 31. In other words, the magnetic sensor 20 is disposed in an inner space (gap) defined by substantially the U-shaped core 31a.

In this case, the bias magnetic field Bb is generated by supplying the electric current to the core coil 31. Therefore, the magnitude of the bias magnetic field Bb can be arbitrary changed by changing the electric current supplied to the core coil 31. As such, detection sensitivity and detection range can be flexibly changed, and hence applicability improves.

The shape of the core 31a is not limited to substantially the U-shape. The core 31a may have a shape including only the first part 31b.

In the above, an example where the bias magnetic field Bb is generated by supplying the electric current to the core coil 31 has been described. As another example, the bias magnetic field Bb may be generated by supplying the electric current to an air-cored coil without having the core. In this case, since the bias magnetic field generating element does not include the core, the temperature characteristic of the magnetic field Bb can be reduced. Therefore, detection accuracy improves. Also, in the case where the magnetic field generating element is provided by the air-cored coil without having the core, the magnetic sensor 20 may be disposed inside of the air-cored coil. Therefore, the size of the current sensor 1 can be reduced.

(Fourth Embodiment)

A fourth embodiment of the present disclosure will be hereinafter described.

Figure 8:
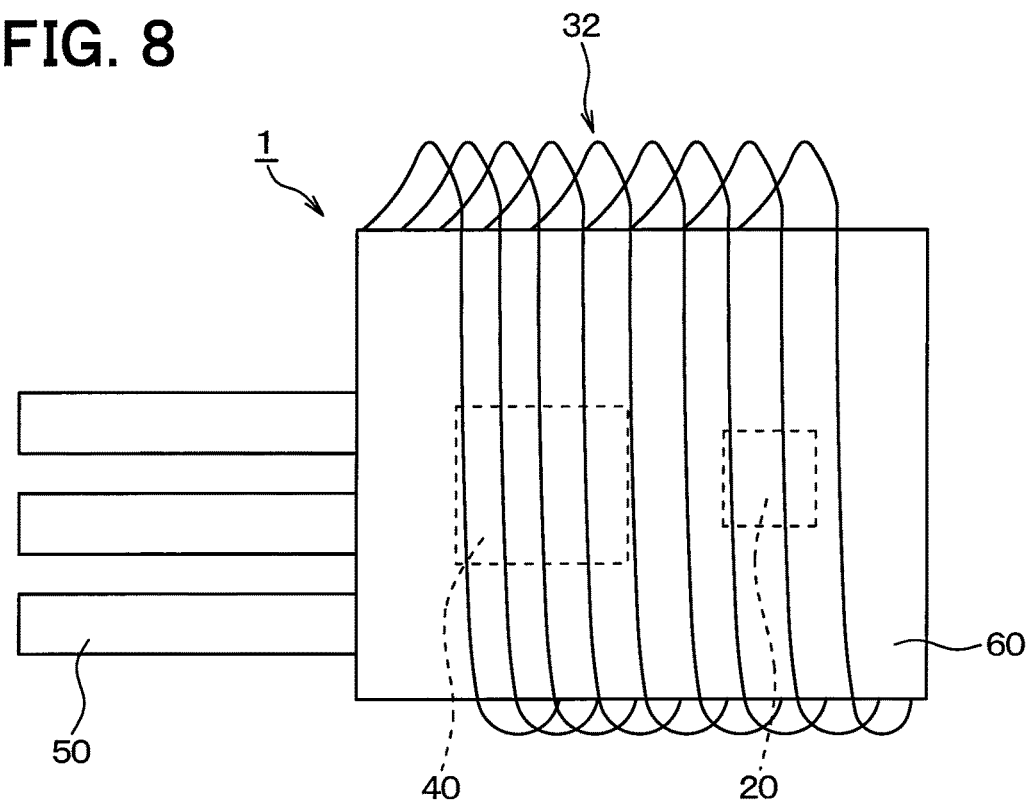
FIG. 8 is a diagram illustrating a schematic plan view of a current sensor according to a fourth embodiment of the present disclosure.

In a current sensor 1 according to the fourth embodiment, the magnetic field generating element has a structure different from the third embodiment. Other structures of the fourth embodiment will be the same as the third embodiment, and a description thereof will not be repeated. FIG. 8 is a diagram illustrating a schematic plan view of the current sensor 1 according to the fourth embodiment.

As shown in FIG. 8, the bias magnet 30 is not disposed on the substrate 10. Instead, the current sensor 1 has a coil 32 provided by a winding wound around the outside of the molded resin 60. The coil 32 is electrically connected to the circuit chip 40, and is supplied with an electric current from the circuit chip 40. The bias magnetic field Bb is generated by supplying the electric current to the coil 32. The bias magnetic field Bb is applied to the magnetic sensor 20. Namely, the coil 32 corresponds to the magnetic field generating element.

When the electric current is supplied to the coil 32, the bias magnetic field Bb is generated in a direction parallel to a left and right direction of FIG. 8. The coil 32 is covered with an insulating member. Thus, the coil 32 is not electrically connected to the bus bar 70 when the current sensor 1 is attached to the bus bar 70.

Also in this case, the advantageous effects similar to the third embodiment will be achieved.

(Fifth Embodiment)

A fifth embodiment of the present disclosure will be hereinafter described.

In each of the embodiments described above, the current sensor 1 is configured such that the magnetization direction of the first detection unit 21 is perpendicular to the bias magnetic field Bb and the magnetization direction of the second detection unit 22 is parallel to the bias magnetic field Bi. Further, the current sensor 1 is attached to the bus bar 70 such that the magnetization direction of the first detection unit 21 is parallel to the current magnetic field Bi and the magnetization direction of the second detection unit 22 is perpendicular to the current magnetic field Bi. However, there is a possibility that the magnetic sensor 20 is misaligned or displaced from a predetermined arrangement position. Also, there is a possibility that the current sensor 1 is misaligned or displaced from a predetermined arrangement position.

Namely, there is a possibility that the magnetization direction of the first detection unit 21 is not perpendicular to the bias magnetic field Bb and the magnetization direction of the second detection unit 22 is not parallel to the bias magnetic field Bb due to an angle displacement between the magnetic sensor 20 and the bias magnet 30. Also, there is a possibility that the magnetization direction of the first detection unit 21 is not parallel to the current magnetic field Bi and the magnetization direction of the second detection unit 22 is not perpendicular to the current magnetic field Bi due to an angle displacement between the current sensor 1 (magnetic sensor 20) and the bus bar 70.

In such cases, the signals Va1, Va2, Vb1, Vb2 outputted from the first and second detection units 21, 22 contain a component due to such angle displacement. Therefore, if the calculation circuit 44 directly outputs the signal that is provided by performing the division of the signal Va by the signal Vb as the sensor signal, the sensor signal contains the component due to the angle displacement, and hence detection accuracy will be reduced.

Figure 9:
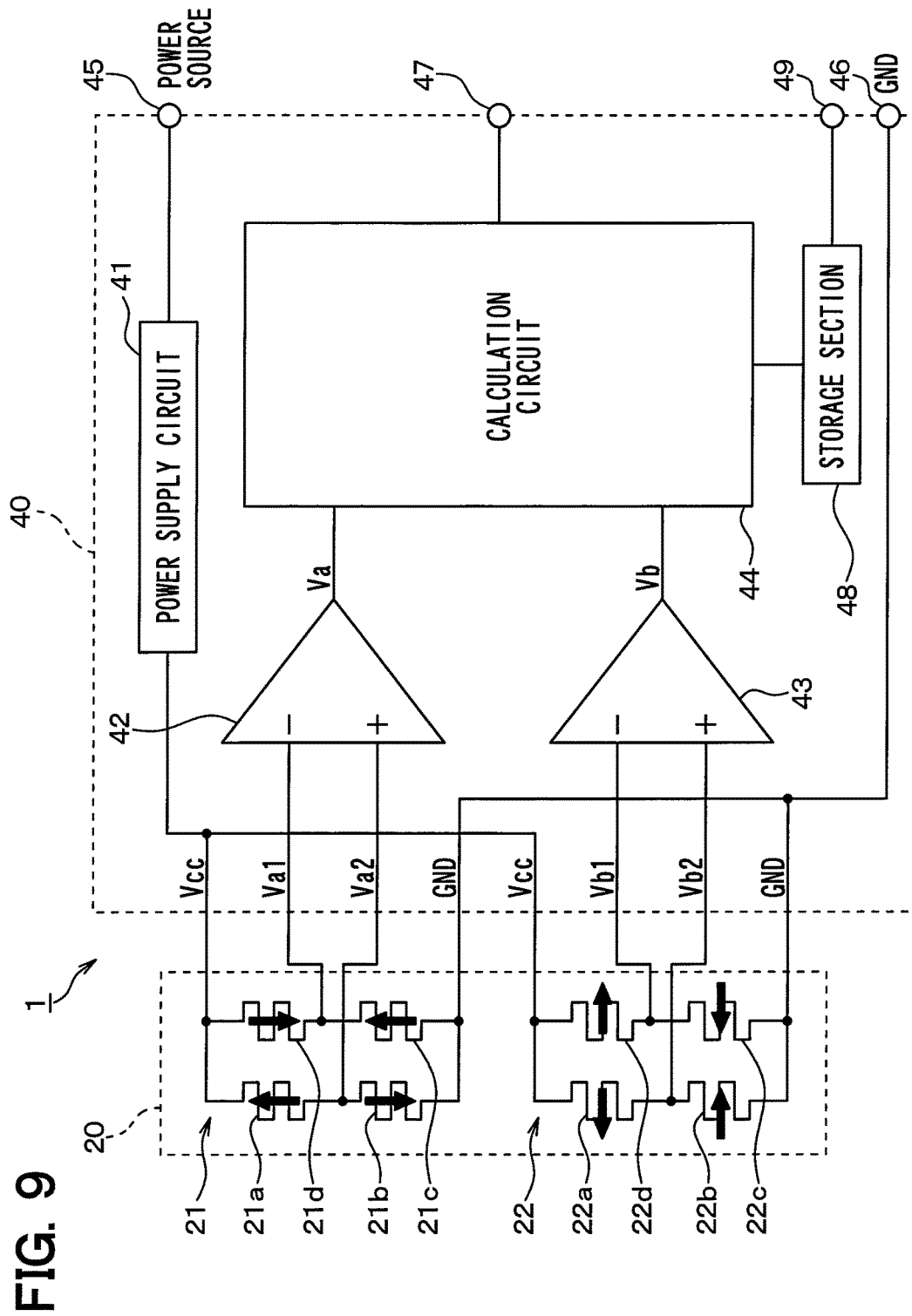
FIG. 9 is a schematic circuit diagram of a current sensor according to a fifth embodiment of the present disclosure.

In the current sensor 1 according to the present embodiment, the calculation circuit 44 is configured to compensate the angle displacement with respect to each of the embodiments described above. Other structures of the present embodiment will be the same as the first embodiment, and a description thereof will not be repeated. FIG. 9 is a schematic circuit diagram of the current sensor 1 according to the present embodiment.

As shown in FIG. 9, the circuit chip 40 includes a storage section 48 that is connected to the calculation circuit 44. The storage section 48 is, for example, provided by an EPROM or the like. The storage section 48 receives the angle displacement between the magnetic sensor 20 and the bias magnet 30 and the angle displacement between the current sensor 1 (magnetic sensor 20) and the bus bar 70 through a terminal 49, and stores the angle displacements therein. The storage section 48 corresponds to a storage element.

The calculation circuit 44 reads out the angle displacements stored in the storage section 48 when calculating the sensor signal using the signals Va, Vb outputted from the first and second differential amplifying circuits 42, 43. The calculation circuit 44 performs compensation calculation using the angle displacements, and outputs the calculation result as the sensor signal.

Hereinafter, an operational expression for the compensation calculation using the angle displacement between the magnetic sensor 20 and the bias magnet 30 and the angle displacement between the current sensor (magnetic sensor 20) and the bus bar 70 will be described.

Figure 10:
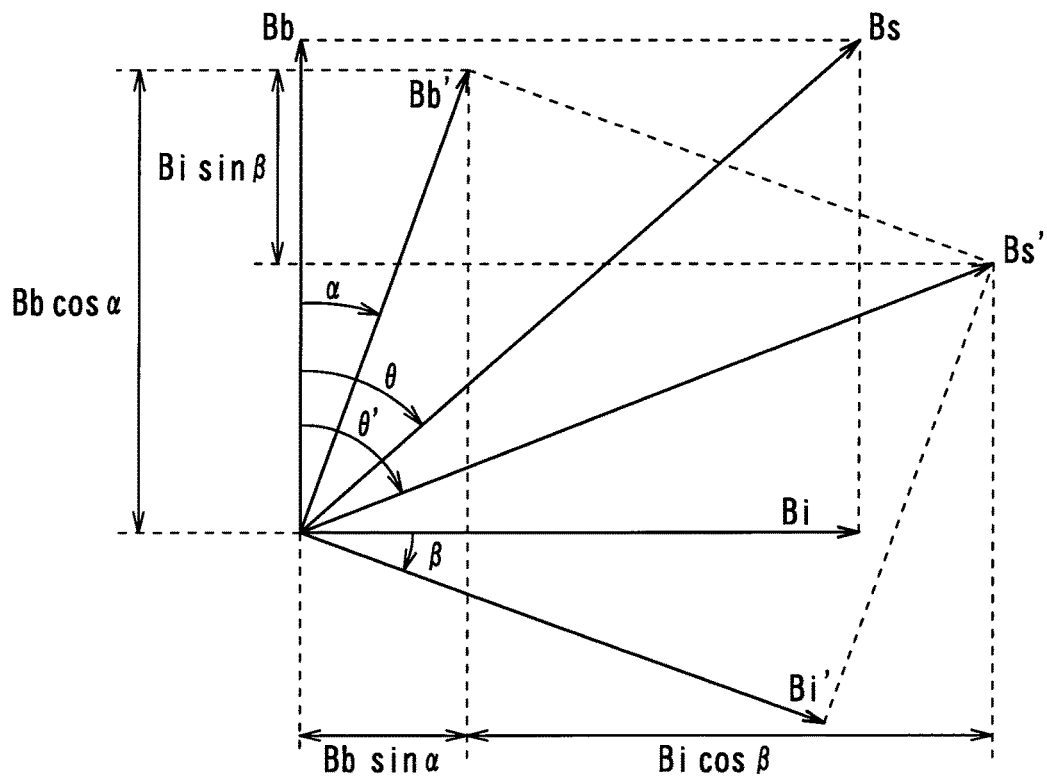
FIG. 10 is a diagram for explaining an angle displacement in the current sensor according to the fifth embodiment.

FIG. 10 is a diagram for explaining the angle displacements. In FIG. 10, Bb denotes an ideal bias magnetic field applied to the magnetic sensor 20; Bi denotes an ideal current magnetic field applied to the magnetic sensor 20; and Bs denotes an ideal synthetic magnetic field composed of the ideal bias magnetic field Bb and the ideal current magnetic field Bi. Also, Bb' denotes an actual bias magnetic field actually applied to the magnetic sensor 20; Bi' denotes an actual current magnetic field actually applied to the magnetic sensor 20; and Bs' denotes an actual synthetic magnetic field composed of the actual bias magnetic field Bb' and the actual current magnetic field Bi'. Further, α denotes the angle displacement between the magnetic sensor 20 and the bias magnet 30, that is, an angle defined between the ideal bias magnetic field Bb and the actual bias magnetic field Bb'; β denotes the angle displacement between the magnetic sensor 20 and the bus bar 70, that is, an angle defined between the ideal current magnetic field Bi and the actual current magnetic field Bi'. Furthermore, θ denotes an angle defined between the ideal bias magnetic field Bb and the ideal synthetic magnetic field Bs; and θ' denotes an angle defined between the ideal bias magnetic field Bb and the actual synthetic magnetic field Bs'.

Here, the ideal bias magnetic field Bb is a bias magnetic field that is to be parallel to the magnetization direction of the second detection unit 22. In other words, the ideal bias magnetic field Bb is a bias magnetic field that is applied to the magnetic sensor 20 when there is no angle displacement between the magnetic sensor 20 and the bias magnet 30. Namely, the angle α defined between the ideal bias magnetic field Bb and the actual bias magnetic field Bb' corresponds to an angle defined between the magnetization direction of the second detection unit 22 and the actual bias magnetic field Bb'.

The ideal current magnetic field Bi is a current magnetic field that is to be parallel to the magnetization direction of the first detection unit 21. In other words, the ideal current magnetic field Bi is a current magnetic field that is applied to the magnetic sensor 20 when there is no angle displacement between the magnetic sensor 20 and the bus bar 70. Namely, the angle β defined between the ideal current magnetic field Bi and the actual current magnetic field Bi' corresponds to an angle defined between the magnetization direction of the first detection unit 21 and the actual current magnetic field Bi'.

In the present embodiment, the ideal current magnetic field Bi corresponds to an ideal first magnetic field, and the ideal bias magnetic field Bb corresponds to an ideal second magnetic field.

In a case where the angle defined between the ideal bias magnetic field Bb and the actual bias magnetic field Bb' is the angle α (hereinafter simply referred to as the angle displacement α) and the angle defined between the ideal current magnetic field Bi and the actual current magnetic field Bi' is the angle β (hereinafter, simply referred to as the angle β), as shown in FIG. 10, the angle defined between the ideal bias magnetic field Bb and the actual synthetic magnetic field Bs' is the angle θ'. Therefore, tan θ' is calculated in the calculation circuit 44 by performing the division of the signal Va by the signal Vb, and is expressed as the following formula 3.

$$\tan\theta' = \frac{Bb \cdot \sin\alpha - Bs \cdot \cos\beta}{Bb \cdot \cos\alpha - Bs \cdot \sin\beta} \quad \text{[Formula 3]}$$

In the formula 3, Bb is a magnitude of the ideal bias magnetic field, and Bs is a magnitude of the ideal synthetic magnetic field. Further, the tan θ is defined as tan θ=Bs/Bb.

Therefore, the formula 3 can be transformed into the following formula 4 by substituting the tan θ for the formula 3.

$$\tan\theta = \frac{\tan\theta' \cdot \cos\alpha - \sin\alpha}{\tan\theta' \cdot \sin\beta + \cos\beta} \quad \text{[Formula 4]}$$

In this way, the calculation circuit 44 calculates a signal tan θ' containing the angle displacements by performing the division of the signal Va outputted from the first differential amplifying circuit 42 by the signal Vb outputted from the second differential amplifying circuit 43, and substitutes the tan θ' and the angle displacements α, β for the formula 4. Therefore, the calculation circuit 44 can calculate the tangential value (tan θ) in which the angle displacements are compensated.

The calculation circuit 44 reads out the angle displacements α, β stored in the storage section 48, and performs the calculation of the formula 4 using the signals Va, Vb and the angle displacements α, β. Further, the calculation circuit 44 outputs the calculation value as the sensor signal.

Figure 11:
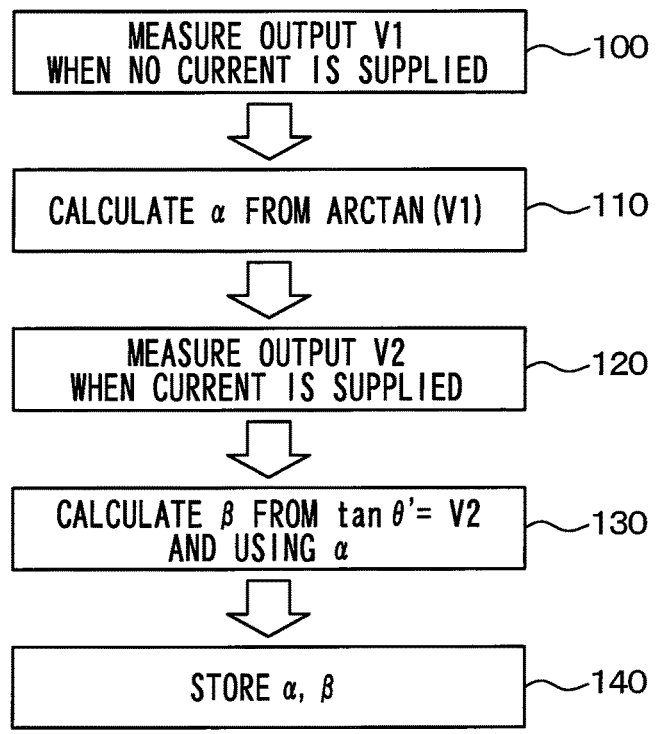
FIG. 11 is a flowchart illustrating a process of writing the angle displacement to a storage section of the current sensor according to the fifth embodiment.

Next, a process of writing the angle displacements α, β in the storage section 48 will be described. FIG. 11 is a flowchart illustrating the process of writing the angle displacements α, β in the storage section 48. In the present embodiment, the process is performed after the current sensor 1 is attached to the bus bar 70 and in a state where the current sensor 1 is electrically connected to an external circuit through the leads 50.

First, at 100, in a state where the detection current is not supplied to the bus bar 70, an output V1 from the current sensor 1 is measured. In a case where there is the angle displacement α between the magnetic sensor 20 and the bias magnet 30, as shown in FIG. 10, the ideal bias magnetic field Bb and the actual bias magnetic field Bb' are not parallel to each other. That is, the magnetization direction of the first detection unit 21 and the bias magnetic field Bb' are not perpendicular to each other, and magnetization direction of the second detection unit 22 and the bias magnetic field Bb' are not parallel to each other.

Therefore, even in the state where the current is not supplied to the bus bar 70, the signals Va1, V2a, Vb1, Vb2 according to the angle displacement α are outputted from the first and second detection units 21, 22. Namely, a signal V1 outputted from the current sensor 1 corresponds to the tan α and is defined as tan α=V1.

At 110, arctan (V1) is calculated in the external circuit to obtain the angle displacement α.

At 120, a predetermined current is supplied to the bus bar 70, and an output V2 from the current sensor 1 is measured. In a case where there are the angle displacements α, β, a signal V2 outputted from the calculation circuit 44 corresponds to tan θ' and is defined as tan θ'=V2.

At 130, β is calculated by substituting the output V2 and the angle displacement α for the formula 3. The external circuit is beforehand stored with the magnitude of the ideal bias magnetic field Bb and the magnitude of the ideal synthetic magnetic field Bs that is made when the predetermined current is supplied to the bus bar 70.

At 140, the angle displacements α, β are provided to the storage section 48 from the external circuit through the terminal 49, and are written in the storage section 48. Thus, the storage section 48 stores the angle displacements α, β.

As described above, in the current sensor 1 of the present embodiment, the calculation circuit 44 performs the calculation by substituting the angle displacement α, β, which are stored in the storage section 48, for the formula 4, and outputs the calculation value as the sensor signal. In this way, the angle displacements α, β can be compensated, and hence the detection accuracy improves.

(Sixth Embodiment)

A sixth embodiment of the present disclosure will be hereinafter described.

Figure 12:
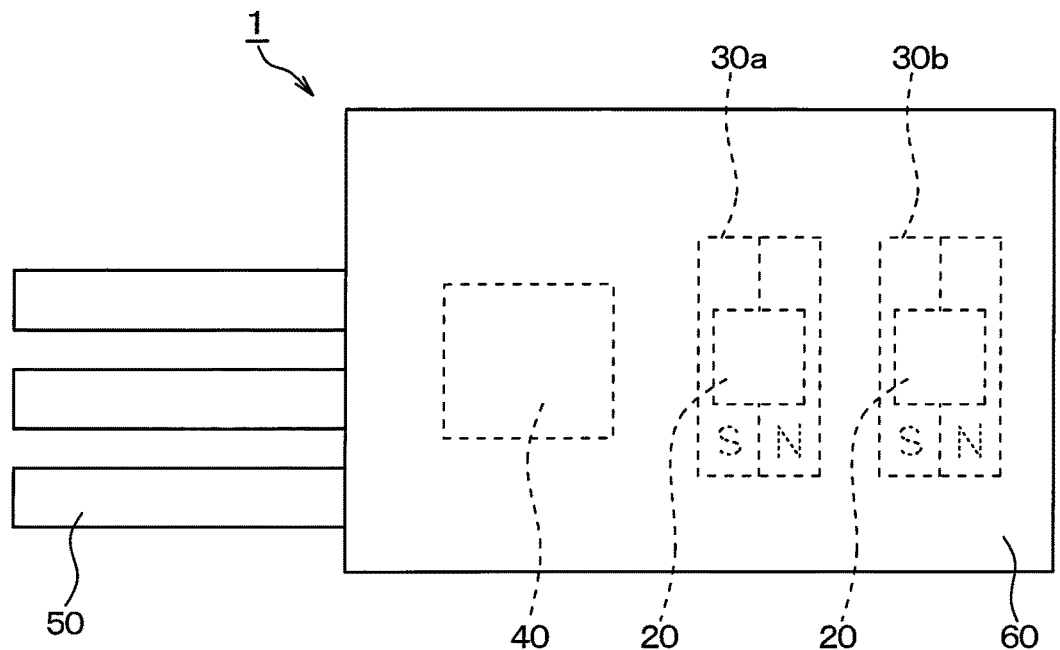
FIG. 12 is a diagram illustrating a schematic plan view of a current sensor according to a sixth embodiment of the present disclosure.

In the sixth embodiment, a current sensor 1 includes two magnetic sensors 20 and two bias magnets 30 with respect to the first embodiment. Other structures of the sixth embodiment will be the same as the first embodiment, and a description thereof will not be repeated. FIG. 12 is a diagram illustrating a schematic plan view of the current sensor 1 according to the sixth embodiment.

Figure 13A:
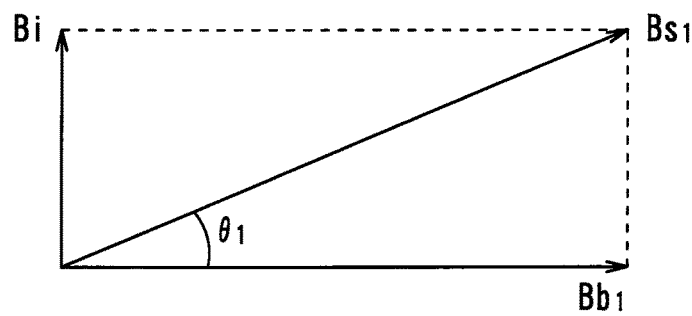
FIG. 13A is a diagram illustrating a first synthetic magnetic field composed of a first bias magnetic field of a first bias magnet and a current magnetic field according to the sixth embodiment.
Figure 13B:
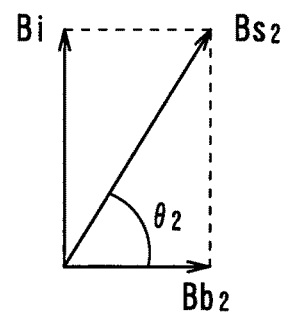
FIG. 13B is a diagram illustrating a second synthetic magnetic field composed of a second bias magnetic field of a second bias magnet and a current magnetic field according to the sixth embodiment.

As shown in FIG. 12, the current sensor 1 includes a first bias magnet 30a and a second bias magnet 30b on the first surface 10a of the substrate 10. FIG. 13A is a diagram illustrating a first synthetic magnetic field Bs1 composed of a bias magnetic field Bb1 of the first bias magnet 30a and the current magnetic field Bi, and FIG. 13B is a diagram illustrating a second synthetic magnetic field Bs2 composed of a bias magnetic field Bb2 of the second bias magnet 30b and the current magnetic field Bi.

The first bias magnet 30a is made of a ferromagnetic material stronger than the second bias magnet 30b. As shown in FIGS. 13A and 13B, the magnitude of the first bias magnetic field Bb1 generated by the first bias magnet 30a is greater than the magnitude of the second bias magnetic field Bb2 generated by the second bias magnet 30b.

As shown in FIG. 12, the magnetic sensors 20 are respectively disposed on the first and second bias magnets 30a, 30b. Each of the magnetic sensors 20 has a structure same as the magnetic sensor 20 of the first embodiment. Each of the magnetic sensors 20 includes the first detection unit 21 and the second detection unit 22.

Although not illustrated, the calculation circuit 44 is connected to two terminals 47. The calculation circuit 44 performs calculation using the signals outputted from the magnetic sensor 20 disposed on the first bias magnet 30a and outputs a first sensor signal from one of the two terminals 47. Also, the calculation circuit 44 performs calculation using the signals outputted from the magnetic sensor 20 disposed on the second bias magnet 30b and outputs a second sensor signal from the other of the two terminals 47.

In the current sensor 1, in a state where the current flows in the bus bar 70, the magnitude of the first bias magnetic field Bb1 and the magnitude of the second bias magnetic field Bb2 are different from each other. As shown in FIGS. 13A and 13B, therefore, the first synthetic magnetic field Bs1 applied to the magnetic sensor 20 disposed on the first bias magnet 30a and the second synthetic magnetic field Bs2 applied to the magnetic sensor 20 disposed on the second bias magnet 30b are different from each other.

Specifically, the first bias magnetic field Bb1 is greater than the second bias magnetic field Bb2. Therefore, in the state where the current flows in the bus bar 70, an angle θ2 defined between the second bias magnetic field Bb2 and the second synthetic magnetic field Bs2 is greater than an angle θ1 defined between the first bias magnetic field Bb1 and the first synthetic magnetic field Bs1.

Figure 14:
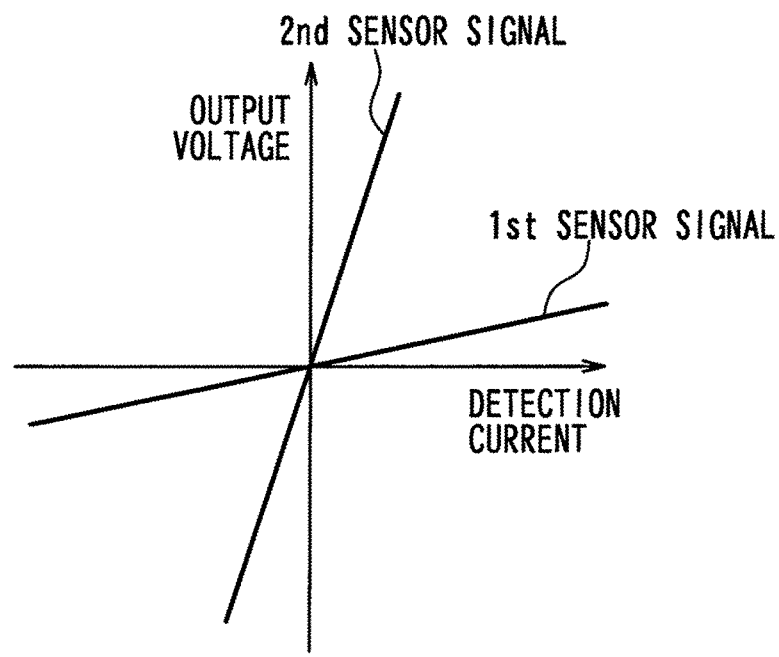
FIG. 14 is a diagram illustrating a relationship between a detection current flowing in a bus bar and a sensor signal outputted from a current sensor according to the sixth embodiment.

Therefore, the first sensor signal and the second sensor signal calculated by the calculation circuit 44 have different values. FIG. 14 is a diagram illustrating a relationship between the detection current flowing in the bus bar 70 and an output voltage with regard to the first and second sensor signals outputted from the calculation circuit 44. As shown in FIG. 14, the gradient of the first sensor signal is smaller than the gradient of the second sensor signal. In other words, the first sensor signal provides wide range output, and the second sensor signal provides high sensitivity output.

Accordingly, in the current sensor 1 of the present embodiment, the current is detected in a wide detection range by the magnetic sensor 20 disposed on the first bias magnet 30a, and the current is detected with high sensitivity by the magnetic sensor 20 disposed on the second bias magnet 30b.

(Seventh Embodiment)

A seventh embodiment of the present disclosure will be hereinafter described.

Figure 15:
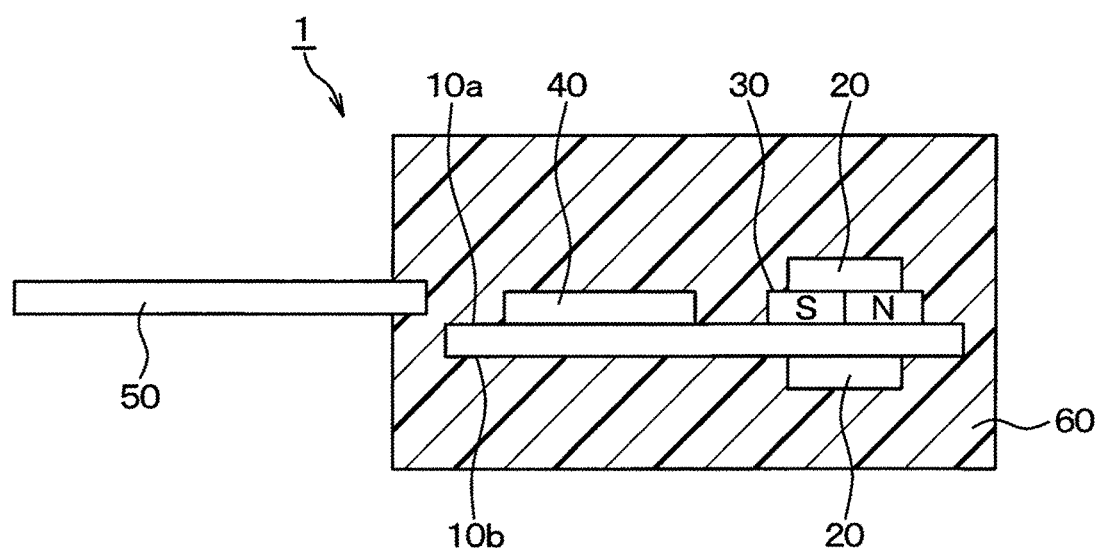
FIG. 15 is a diagram illustrating a schematic sectional view of a current sensor according to a seventh embodiment of the present disclosure.

A current sensor 1 according to the seventh embodiment has one bias magnet 30 with respect to the sixth embodiment. Other structures of the seventh embodiment will be the same as the sixth embodiment, and a description thereof will not be repeated. FIG. 15 is a diagram illustrating a schematic sectional view of the current sensor 1 according to the seventh embodiment.

As shown in FIG. 15, in the current sensor 1 of the present embodiment, one of the magnetic sensors 20 is disposed at the first surface 10a of the substrate 10 through the bias magnet 30, and the other of the magnetic sensors 20 is directly disposed at the second surface 10b of the substrate 10. In other words, the two magnetic sensors 20 are mounted on the substrate 10 such that a distance from the bias magnet 30 is different between the two magnetic sensors 20.

For example, the magnetic sensors 20 are located at the same position with respect to a planar direction of the substrate 10, but are opposite to each other through the bias magnet 30 and the substrate 10. Further, the magnetic sensor 20 disposed at the second surface 10b of the substrate 10 is further from the bias magnet 30 than the magnetic sensor 20 disposed at the first surface 10a of the substrate 10 by the thickness of the substrate 10. In other words, a distance between the magnetic sensor 20 disposed at the second surface 10b of the substrate 10 and the bias magnet 30 is greater than a distance between the magnetic sensor 20 disposed at the first surface 10a of the substrate 10 and the bias magnet 30 by the thickness of the substrate 10.

In addition, the bias magnetic field Bb that is applied to the magnetic sensor 20 disposed at the bias magnet 30 is greater than the bias magnetic field Bb that is applied to the magnetic sensor 20 disposed at the second surface 10b of the substrate 10. Here, the two magnetic sensors 20 have the same structure, similar to the sixth embodiment.

In this way, the two magnetic sensors 20 are mounted on the substrate 10 such that the distance from the bias magnet 30 is different between the two magnetic sensors 20, and hence the magnitude of the bias magnetic field Bb applied to each of the two magnetic sensors 20 is different between the two magnetic sensors 20. Also in this case, the advantageous effects similar to the sixth embodiment can be achieved.

In the example described above, the two magnetic sensors 20 are mounted on opposite sides of the substrate 10. As another example of the arrangement of the two magnetic sensors 20 for differentiating the distance from the bias magnet 30 between the two magnetic sensors 20, the magnetic sensors 20 may be disposed such that one of the magnetic sensors 20 is disposed adjacent to the bias magnet 30 on the first surface 10a of the substrate 10, and the other of the magnetic sensors 20 is disposed opposite to the bias magnet 30 with respect to the one of the magnetic sensors 20 on the first surface 10a of the substrate 10.

(Eighth Embodiment)

An eighth embodiment of the present disclosure will be hereinafter described.

Figure 16:
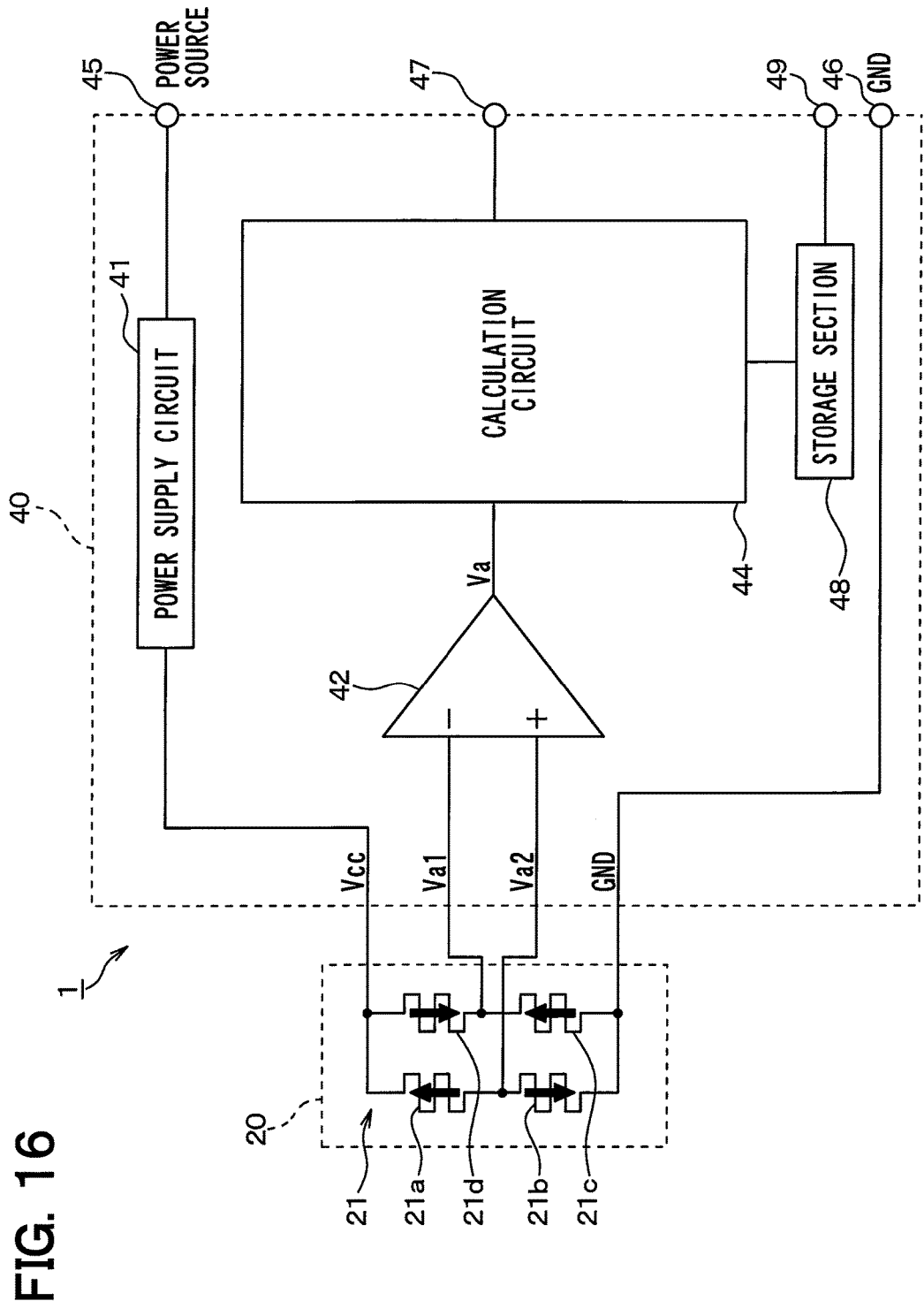
FIG. 16 is a schematic circuit diagram of a current sensor according to an eighth embodiment of the present disclosure.

In a current sensor 1 according to the eighth embodiment, the magnetic sensor 20 includes only the first detection unit 21 with respect to the first embodiment. Other structures of the current sensor 1 will be the same as the first embodiment, a description thereof will not be repeated. FIG. 16 is a circuit diagram of the current sensor 1 according to the present embodiment.

As shown in FIG. 16, in the present embodiment, the magnetic sensor 20 includes the first detection unit 21, but does not include the second detection unit 22. Further, the circuit chip 40 is provided with the storage section 48, similar to the fifth embodiment. The storage section 48 of the present embodiment stores an amplification factor G of the first differential amplifying circuit 42, a voltage Vcc applied to the first detection unit 21, and a temperature characteristic k(t) of the first detection unit 21.

The calculation circuit 44 receives the signal Va expressed by the formula 1 from the first differential amplifying circuit 42. The calculation circuit 44 calculates $\sin\theta$ from the signal Va using the amplification factor G, the voltage Vcc and the temperature characteristic k(t), which are stored in the storage section 48. Further, the calculation circuit 44 calculates $\cos\theta$ from the $\sin\theta$ as the $\cos\theta$ is defined as $\cos\theta=(1-\sin\theta^2)^{1/2}$. Moreover, the calculation circuit 44 obtains a calculation value Vc expressed by the following formula 5 using the amplification factor G, the voltage Vcc, and the temperature characteristic k(t), which are stored in the storage section 48.

$$Vc=G \cdot Vcc \cdot K(t) \cdot \cos\theta \qquad \text{[Formula 5]}$$

The calculation circuit 44 performs division of the value of the signal Va by the calculation value Vc to calculate the tangential value, and outputs a signal corresponding to the tangential value as the sensor signal.

As described above, even in the case where the magnetic sensor 20 includes the first detection unit 21 and does not include the second detection unit 22, the calculation value Vc can be calculated using the $\cos\theta$, and the tangential value can be calculated by dividing the value of the signal Va by the calculation value Vc. Also in this case, the advantageous effects similar to the first embodiments can be achieved.

In the example described above, the magnetic sensor 20 includes only the first detection unit 21. As another example, the magnetic sensor 20 may include only the second detection unit 22. In this case, the calculation circuit 44 receives the signal Vb expressed by the formula 2 from the second detection unit 22. The calculation circuit 44 calculates $\sin\theta$ from the signal Vb, and calculates the tangential value from the signal Vb and the calculation value obtained using the $\sin\theta$.

(Ninth Embodiment)

A ninth embodiment of the present disclosure will be hereinafter described.

Figure 17:
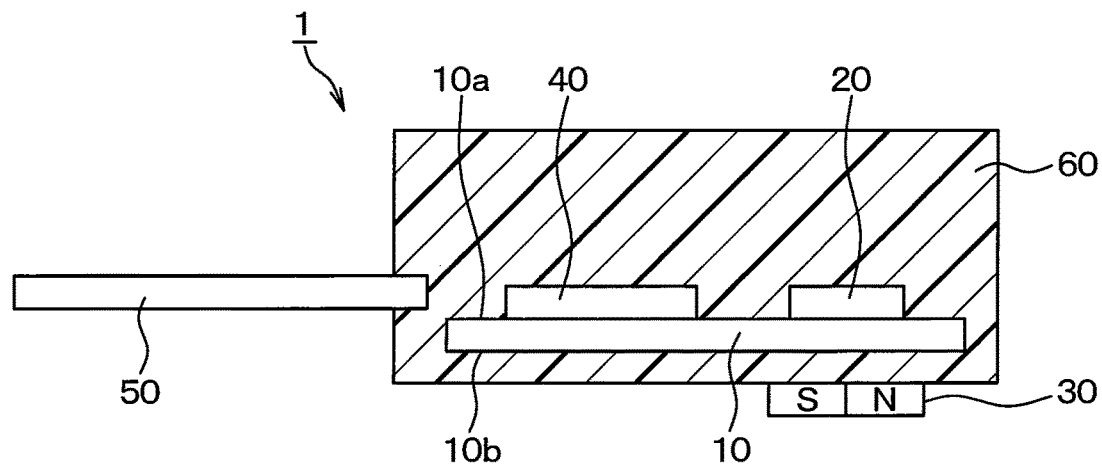
FIG. 17 is a diagram illustrating a schematic sectional view of a current sensor according to a ninth embodiment of the present disclosure.

In a current sensor 1 according to the ninth embodiment, the bias magnet 30 is disposed outside of the molded resin 60 with respect to the first embodiment. Other structures of the ninth embodiment will be the same as the first embodiment, and a description thereof will not be repeated. FIG. 17 is a diagram illustrating a schematic sectional view of the current sensor 1 according to the ninth embodiment.

As shown in FIG. 17, the magnetic sensor 20 and the circuit chip 40 are sealed in the molded resin 60, and the bias magnet 30 is disposed outside of the molded resin 60. In this case, a mold IC sealed in the molded resin 60 can be reduced in size.

(Tenth Embodiment)

A tenth embodiment of the present disclosure will be hereinafter described.

Figure 18:
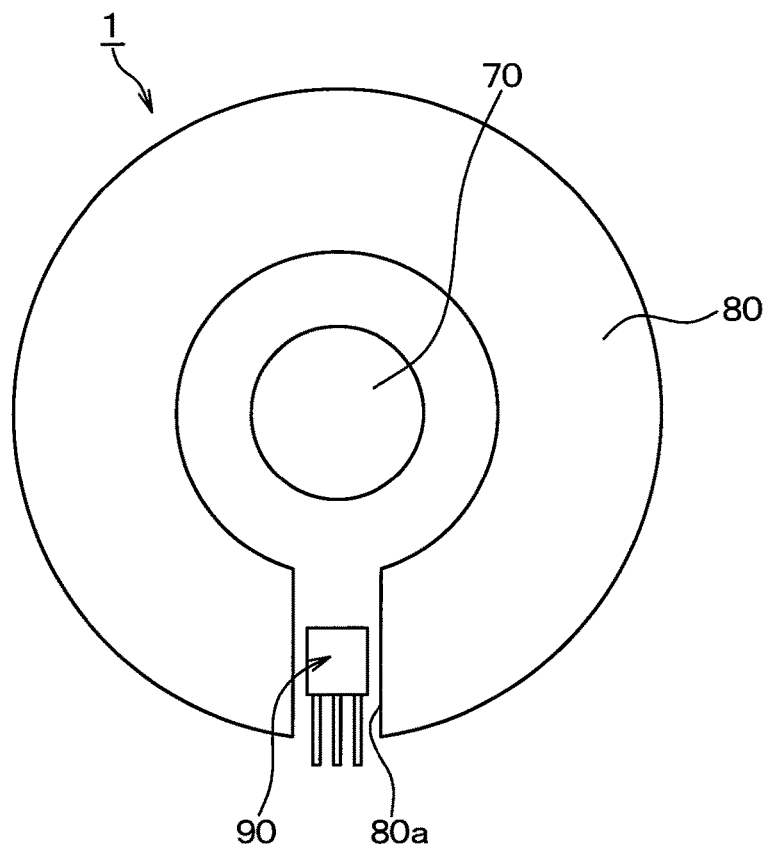
FIG. 18 is a diagram illustrating a schematic view of a current sensor attached to a bus bar, according to a tenth embodiment of the present disclosure.

A current sensor 1 according to the tenth embodiment includes a magnetic core with respect to the first embodiment. Other structures of the tenth embodiment will be the same as the first embodiment, and a description thereof will not be repeated. FIG. 18 is a diagram illustrating the current sensor 1 attached to the bus bar 70.

As shown in FIG. 18, the current sensor 1 includes a magnetic core 80. The magnetic core 80 surrounds an outer periphery of the bus bar 70 and defines a gap 80a at a part. The magnetic core 80 serves to concentrate the current magnetic field Bi. The magnetic core 80 is made of a permalloy of iron and nickel, such as by shaping, forging and the like.

The magnetic core 80 is disposed in a case (not shown) and held on the outer periphery of the bus bar 70. An installation part of the case is arranged at the gap 80a of the magnetic core 80, and a molded IC 90 in which the components of the current sensor 1, such as the magnetic sensor 20 and the like, are molded is disposed in the installation part.

In this structure, the current magnetic field Bi concentrated by the magnetic core 80 is applied to the molded IC 90 (magnetic sensor 20). Therefore, even a small current flowing in the bus bar 70 can be detected, and hence detection sensitivity improves.

In the current sensor 1 illustrated in FIG. 18, the current magnetic field Bi is applied to the molded IC 90 in a direction parallel to a left and right direction of FIG. 18. Therefore, the bias magnet 30 is disposed such that the bias magnetic field Bb is generated in a direction parallel to an up and down direction of FIG. 18.

(Eleventh Embodiment)

An eleventh embodiment of the present disclosure will be hereinafter described.

Figure 19:
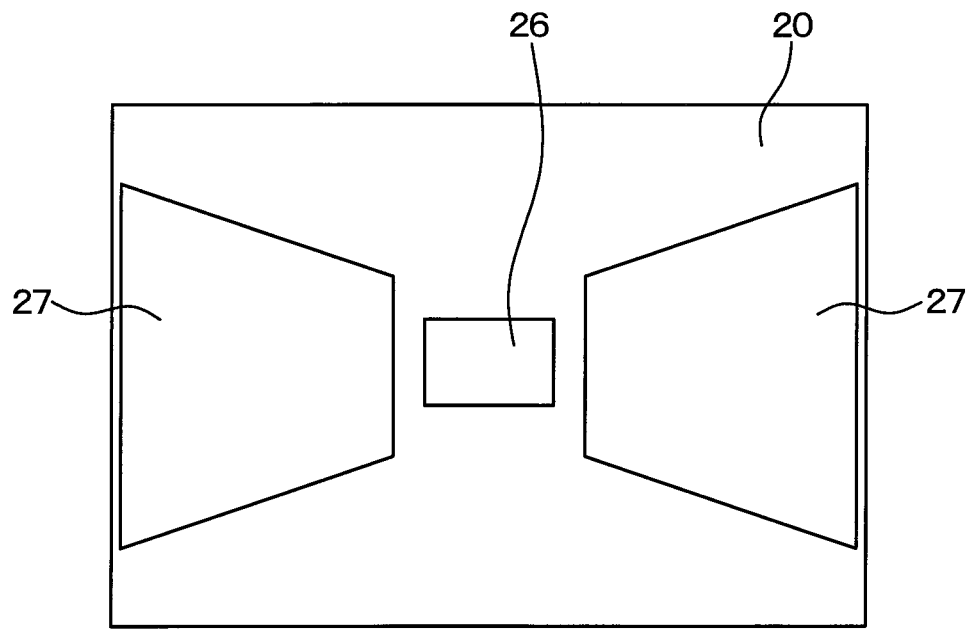
FIG. 19 is a diagram illustrating a schematic plan view of a magnetic sensor of a current sensor according to an eleventh embodiment of the present disclosure.

In a current sensor 1 according to the eleventh embodiment, the magnetic sensor 20 includes a magnetic core with respect to the structure of the first embodiment. Other structures of the eleventh embodiment will be the same as the first embodiment, and a description thereof will not be repeated. FIG. 19 is a diagram illustrating a schematic plan view of the magnetic sensor 20 according to the eleventh embodiment.

As shown in FIG. 19, the magnetic sensor 20 has a magnetoresistive element formation region 26 and magnetic cores 27. The magnetoresistive elements 21a to 21d and 22a to 22d are formed in the magnetoresistive element formation region 26. The magnetic cores 27 are provided by soft magnetic films and the like. The magnetic cores 27 are, for example, made by a vapor deposition technique or the like.

In the present embodiment, the magnetoresistive elements 21a to 21d and 22a to 22d are applied with the current magnetic field Bi that is concentrated by the magnetic cores 27. Therefore, the detection sensitivity further improves, similar to the tenth embodiment.

(Twelfth Embodiment)

A twelfth embodiment of the present disclosure will be hereinafter described.

Figure 20:
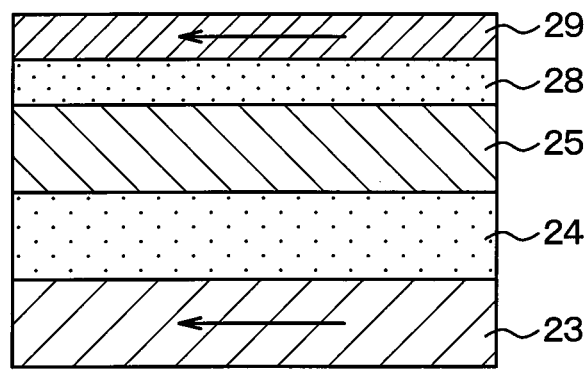
FIG. 20 is a diagram illustrating a schematic sectional view of a magnetoresistive element of a magnetic sensor of a current sensor according to a twelfth embodiment of the present disclosure.

A current sensor 1 according to the twelfth embodiment has the magnetic field generating element that is different from the first embodiment. Other structures of the twelfth embodiment will be the same as the first embodiment, and a description thereof will not be repeated. FIG. 20 is a diagram illustrating a schematic sectional view of the magnetoresistive element of the current sensor 1 according to the twelfth embodiment.

As shown in FIG. 20, the magnetoresistive element includes a protective film 28 and a ferromagnetic film 29, in addition to the pin layer 23, the tunnel layer 24 and the free layer 25. The protective film 28 is made of an insulating material or the like, and disposed on the free layer 25. The ferromagnetic film 29 is disposed on the protective film 28 to apply the bias magnetic field Bb to the free layer 25. The ferromagnetic film 29 corresponds to the magnetic field generating element. Namely, the ferromagnetic film 29 is provided, in place of the bias magnet 30. Because the bias magnet 30 is not necessary, the size of the substrate 10 can be reduced with respect to the planar direction thereof.

In the above example, the bias magnetic field Bb is applied to the free layer 25 by the ferromagnetic film 29. As another example, the material of the pin layer 23 may be suitably selected without having the ferromagnetic film 29, such that the bias magnetic field Bb is applied to the free layer 25 by the pin layer 23 In this case, the pin layer 23 corresponds to the magnetic field generating element.

(Other Embodiments)

In the first through seventh embodiments described above, the first detection unit 21 exemplarily outputs the signal containing the sine value and the second detection unit 22 exemplarily outputs the signal containing the cosine value. Alternatively, the arrangement of the magnetic sensor 20 and the bias magnet 30 may be changed such that the first detection unit 21 outputs the signal containing the cosine value and the second detection unit 22 outputs the signal containing the sine value.

In the first through seventh embodiments described above, each of the first and second detection units 21, 22 includes the magnetoresistive elements 21a to 21d, 22a to 22d, which form a bridge circuit. As another example, the first detection unit 21 may include a single magnetoresistive element 21a and the second detection unit 22 may include a single magnetoresistive element 22a. Also in the eighth embodiment, the first detection unit 21 may include a single magnetoresistive element 21a.

In each of the embodiments described above, the circuit chip 40 is sealed in the molded resin 60 with the magnetic sensor 20. In place of sealing the circuit chip 40 in the molded resin 60, for example, a signal processing circuit section for processing the signal outputted from the magnetic sensor 20 may be provided external to the molded resin 60.

In this case, the signal outputted from the magnetic sensor 20 may be transmitted to the signal processing circuit section through the leads 50. For example, the current sensor 1 may be installed in a vehicle. The calculation described above using the signals outputted from the magnetic sensor 20 may be performed in an electronic control unit (ECU) mounted in the vehicle. In this case, the ECU of the vehicle corresponds to the signal processing unit.

In the third and fourth embodiments described above, the bias magnetic field Bb is exemplarily generated by the coil 31, 32. In place of generating the bias magnetic field Bb by the coil 31, 32, the bias magnetic field Bb may be generated by a thin film coil formed in the magnetic sensor 20.

In this case, the thin film coil may be formed in each of the magnetoresistive elements 21a to 21d and 22a to 22d of the magnetic sensor 20, or may be formed on the free layer 25 of each of the magnetoresistive elements 21a to 21d and 22a to 22d. Further, the thin film coil may be formed at a place different from each of the magnetoresistive elements 21a to 21d, and 22a to 22d. In these cases, the size of the molded IC can be further reduced, as compared with the structures of the third and fourth embodiments described above.

In the fifth embodiment described above, the angle displacements $\alpha$, $\beta$ are exemplarily obtained by the calculation. As another example, the angle displacements $\alpha$, $\beta$ may be measured by visual inspection.

In the fifth embodiment described above, the angle displacements $\alpha$, $\beta$ are calculated and stored in the storage section 48 after the current sensor 1 is attached to the bus bar 70, as an example. As another example, the angle displacement $\alpha$, may be calculated and stored in the storage section 48 before the current sensor 1 is attached to the bus bar 70, and the angle displacement $\beta$ may be calculated and stored in the storage section 48 after the current sensor 1 is attached to the bus bar 70.

In the fifth embodiment described above, the angle displacements $\alpha$, $\beta$ are exemplarily compensated. As another example, one of the angle displacements $\alpha$, $\beta$ may be compensated. For example, the calculation circuit 44 may calculate the signal tan $\theta'$ containing the angle displacements by performing the division of the signal Va by the signal Vb, and substitutes the tan $\theta'$ and the angle displacement $\alpha$ for the following formula 6 to calculate a tangential value (tan $\theta$) in which the angle displacement $\alpha$ is compensated.

$$\tan \theta = \tan \theta' \cdot \cos \alpha - \sin \alpha \quad \text{[Formula 6]}$$

The calculation circuit 44 may calculate the signal tan $\theta'$ containing the angle displacements, and substitutes the angle displacement $\beta$ for the following formula 7 to calculate a tangential value (tan $\theta$) in which the angle displacement $\beta$ is corrected.

$$\tan\theta = \frac{\tan\theta'}{\tan\theta' \cdot \sin\beta + \cos\beta} \quad \text{[Formula 7]}$$

As described above, one of the angle displacements $\alpha$, $\beta$ may be compensated by the calculation circuit 44.

In the sixth and seventh embodiments described above, the calculation circuit 44 exemplarily outputs the first sensor signal and the second sensor signal. As another example, the calculation circuit 44 may output one of the first sensor signal and the second sensor signal.

Figure 21:
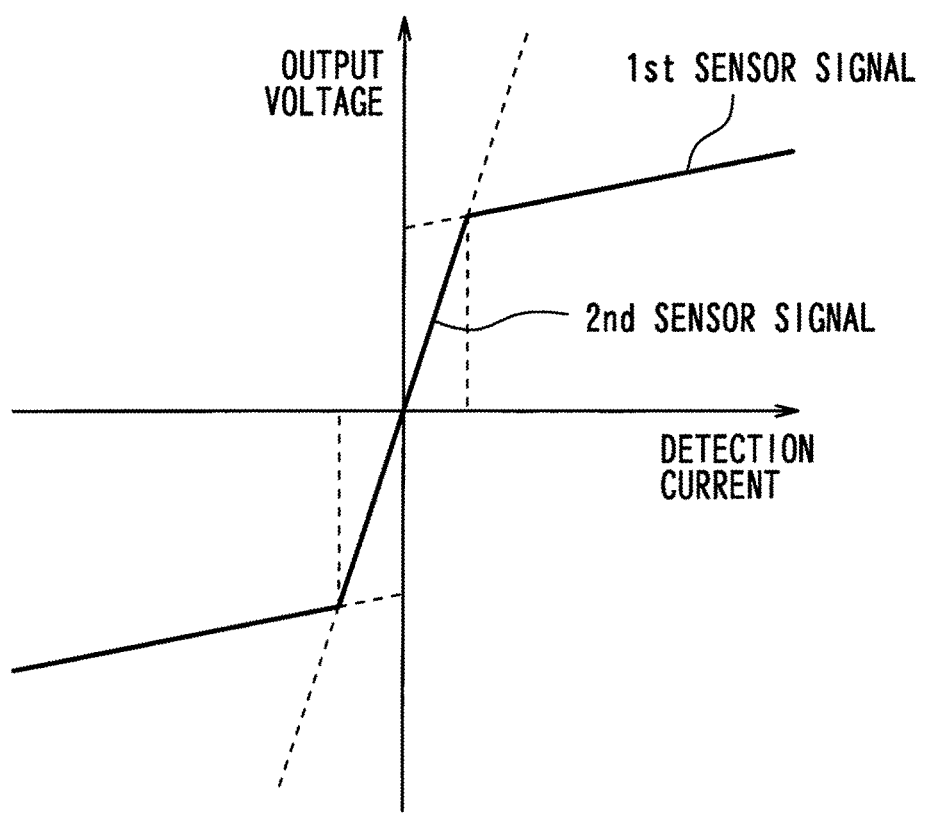
FIG. 21 is a diagram illustrating a relationship between a detection current flowing in a bus bar and a sensor signal outputted from a current sensor according to another embodiment of the present disclosure.

FIG. 21 is a diagram illustrating a sensor signal outputted from the calculation circuit 44 according to another embodiment. As shown in FIG. 21, for example, the calculation circuit 44 may be configured to generate a first sensor signal by adding a predetermined offset to the signal outputted from the magnetic sensor 20 that performs detection in a wide range, and to output one of the first and second sensor signals having a smaller absolute value by comparing the first sensor signal and the second sensor signal to each other.

Figure 22A:
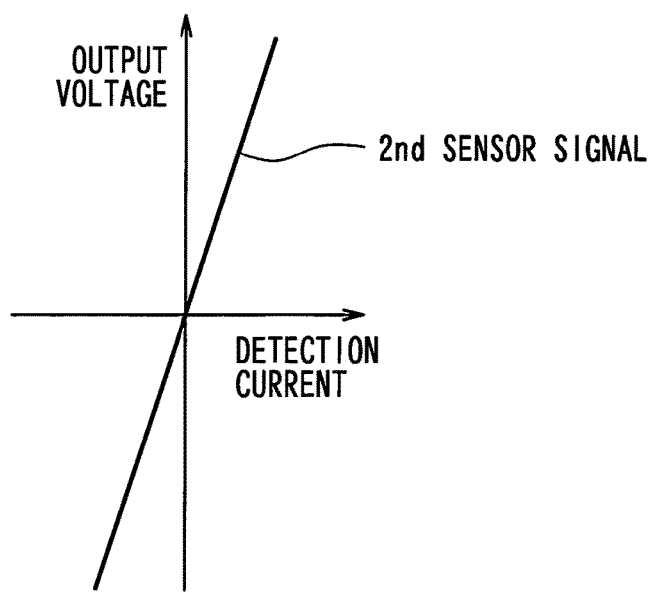
FIG. 22A is a diagram illustrating a relationship between a detection current flowing in a bus bar and a sensor signal outputted from a current sensor, when an engine of a vehicle is in an off state, according to further another embodiment of the present disclosure.
Figure 22B:
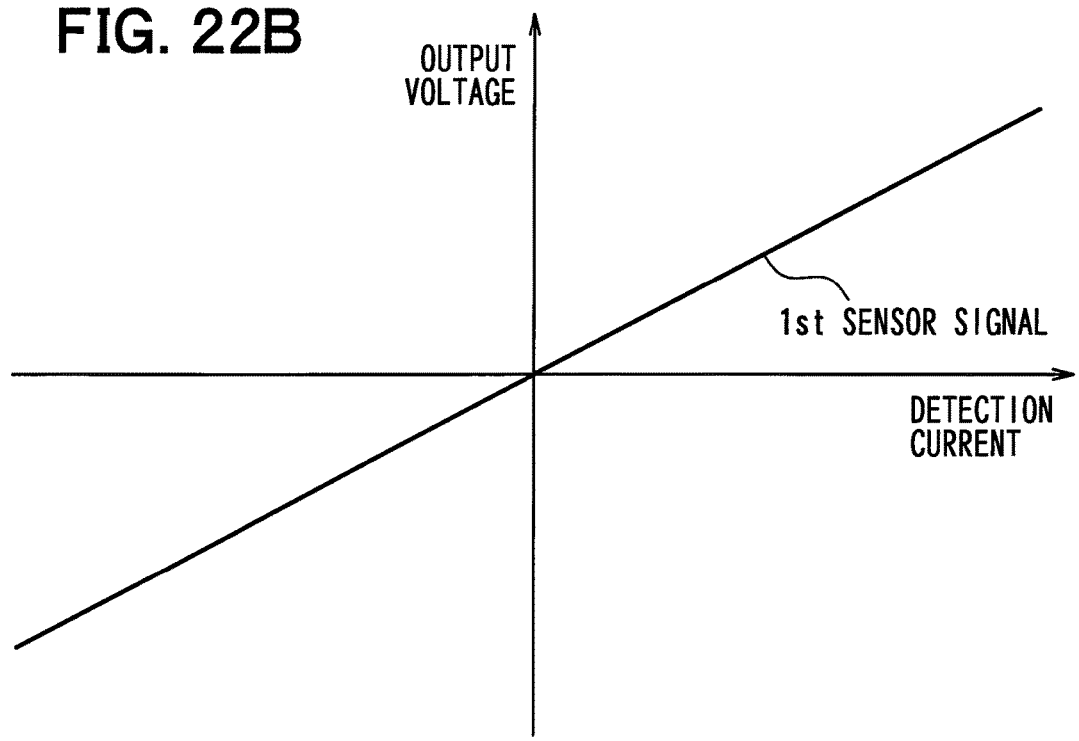
FIG. 22B is a diagram illustrating a relationship between a detection current flowing in a bus bar and a sensor signal outputted from a current sensor, when the engine is in an on state, according to the further another embodiment of the present disclosure.

The calculation circuit 44 may be configured to output the sensor signal in the following manner. FIG. 22A is a diagram illustrating a sensor signal outputted from the calculation circuit 44 when an engine of a vehicle is in an off state, and FIG. 22B is a diagram illustrating a sensor signal outputted from the calculation circuit 44 when the engine of the vehicle is in an on state, according to further another embodiment. Namely, FIGS. 22A and 22B are diagrams illustrating the sensor signal outputted from the current sensor 1 mounted in the vehicle.

For example, the current sensor 1 may be mounted in a vehicle to detect charging and discharging currents of a vehicle battery. In this case, when an engine of the vehicle is in an off state, the current sensor 1 detects an idling current. When the engine of the vehicle is in an on state, the current sensor 1 detects the charging and discharging currents. For the detection of the idling current, the current sensor 1 needs to have high detection sensitivity. For the detection of the charging and discharging currents, the current sensor 1 needs to perform the detection in a wide range. As shown in FIG. 22, therefore, the calculation circuit 44 may be configured to output the second sensor signal that provides the high detection sensitivity when the engine is in an off state, and to output the first sensor signal that provides the wide detection range when the engine is in an on state.

Also in the third and fourth embodiments described above, the current sensor 1 may be configured to perform high sensitivity detection as well as detection in a wide detection range. For example, in the third embodiment, the current flowing in the core coil 31 may be changed at a predetermined timing. Also, in the fourth embodiment, the current flowing in the coil 32 may be changed at a predetermined timing. In these cases, the detection can be performed at high sensitivity and in a wide range.

For example, in a case where the detection sensitivity and the detection range are changed according to the on state and the off state of the engine, the current flowing in the coil 31, 32 may be changed according to the on state and the off state of the engine. Thus, when the engine is in the on state, the detection can be performed in a wide range, and when the engine is in the off state, the detection can be performed with high sensitivity.

In these examples, the predetermined timing means a timing where the engine state is switched from the on state to the off state or from the off state to the on state.

The embodiments described above may be combined in various ways. For example, in the sixth and seventh embodiments described above, the bias magnet 30 may have a substantially U-shape, similar to the second embodiment. As another example, in the sixth and seventh embodiments described above, the bias magnet 30 may be replaced into the core coil 31. As further another example, in the eighth embodiment, the bias magnet 30 may be replaced into the magnetic field generating element of one of the second through fourth embodiments.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A current sensor for detecting an electric current flowing in a current path, the electric current generating a first magnetic field, the current sensor comprising:
    a magnetic field generating element generating a second magnetic field perpendicular to the first magnetic field;
    a magnetic sensor including a magnetoresistive element, the magnetoresistive element including a pin layer, a tunnel layer and a free layer, the pin layer having a fixed magnetization direction, the tunnel layer being provided by an insulating member and being disposed between the pin layer and the free layer, the free layer having a property where a magnetization direction changes according to an external magnetic field, the magnetic sensor generating at least one of a first signal containing a sine value according to an angle defined between the second magnetic field and a synthetic magnetic field composed of the first magnetic field and the second magnetic field and a second signal containing a cosine value according to the angle defined between the second magnetic field and the synthetic magnetic field; and
    a signal processing unit receiving the at least one of the first signal and the second signal, the signal processing unit including a calculation circuit, wherein the calculation circuit calculates a tangential value according to the angle defined between the second magnetic field and the synthetic magnetic field using the at least one of the first signal and the second signal to calculate the first magnetic field/the second magnetic field, and outputs a sensor signal containing the tangential value and the sensor signal is linearly proportional to the first magnetic field.

2. The current sensor according to claim 1, wherein
    the magnetic sensor includes a first detection unit and a second detection unit,
    each of the first detection unit and the second detection unit includes the magnetoresistive element,
    the magnetoresistive element of the first detection unit and the magnetoresistive element of the second detection unit are disposed such that the magnetization directions of the pin layers thereof are perpendicular to each other,
    the magnetoresistive element of the first detection unit outputs the first signal, the magnetoresistive element of the second detection unit outputs the second signal, and
    the calculation circuit calculates the tangential value by performing division of the first signal by the second signal.

3. The current sensor according to claim 1, wherein
    when the calculation circuit receives one of the first signal and the second signal from the magnetic sensor, the calculation circuit calculates one of a cosine value from the sine value of the first signal and a sine value from the cosine value of the second signal, and
    the calculation circuit calculates the tangential value based the one of the cosine value and the sine value calculated and the one of the first signal and the second signal received.

4. The current sensor according to claim 1, wherein
    the magnetic field generating element includes a magnet, and
    the magnetic sensor is disposed on the magnet.

5. The current sensor according to claim 1, wherein
    the magnetic field generating element includes substantially a U-shaped magnet that has a first part and second parts extending perpendicularly from opposite ends of the first part, and
    the magnetic sensor is disposed between the second parts of the U-shaped magnet.

6. The current sensor according to claim 1, wherein
    the magnetic field generating element includes a coil that is configured to generate the second magnetic field when being supplied with an electric current.

7. The current sensor according to claim 6, wherein
    the magnetic field generating element is configured such that a magnitude of the second magnetic field is changed when a value of the electric current supplied to the coil is changed at a predetermined timing.

8. The current sensor according to claim 1, wherein
the magnetic field generating element includes a thin film coil that generates the second magnetic field when being supplied with an electric current, and
the thin film coil is disposed in the magnetic sensor.

9. The current sensor according to claim 1, wherein
the magnetic field generating element includes a ferromagnetic film, and
the ferromagnetic film is disposed on the free layer of the magnetoresistive element.

10. The current sensor according to claim 1, wherein
the pin layer of the magnetoresistive element includes a ferromagnetic film, and
the magnetic field generating element is provided by the ferromagnetic film.

11. The current sensor according to claim 1, wherein
the signal processing unit is disposed in a circuit chip, and
the magnetic sensor and the circuit chip are integrally sealed in a molded resin.

12. The current sensor according to claim 1, wherein
the magnetic sensor is sealed in a molded resin, and
the signal processing unit is electrically connected to the magnetic sensor through a lead to receive the at least one of the first signal and the second signal, the lead extending from an inside of the molded resin to an outside of the molded resin.

13. The current sensor according to claim 1, further comprising:
a magnetic core having a cylindrical shape with a gap to surround the current path, and concentrating the first magnetic field, and
the magnetic sensor is disposed in the gap of the magnetic core.

14. The current sensor according to claim 1, wherein
the magnetic sensor includes a magnetic core for concentrating the first magnetic field.

15. A current sensor for detecting an electric current flowing in a current path, the electric current generating a first magnetic field, the current sensor comprising:
a magnetic field generating element generating a second magnetic field perpendicular to the first magnetic field;
a magnetic sensor including a magnetoresistive element, the magnetoresistive element including a pin layer, a tunnel layer and a free layer, the pin layer having a fixed magnetization direction, the tunnel layer being provided by an insulating member and being disposed between the pin layer and the free layer, the free layer having a property where a magnetization direction changes according to an external magnetic field, the magnetic sensor generating at least one of a first signal containing a sine value according to an angle defined between the second magnetic field and a synthetic magnetic field composed of the first magnetic field and the second magnetic field and a second signal containing a cosine value according to the angle defined between the second magnetic field and the synthetic magnetic field; and
a signal processing unit receiving the at least one of the first signal and the second signal, the signal processing unit including a calculation circuit, wherein the calculation circuit calculates a tangential value according to the angle defined between the second magnetic field and the synthetic magnetic field using the at least one of the first signal and the second signal, and outputs a sensor signal containing the tangential value, wherein
the magnetic sensor includes a first detection unit and a second detection unit,
each of the first detection unit and the second detection unit includes the magnetoresistive element,
the magnetoresistive element of the first detection unit and the magnetoresistive element of the second detection unit are disposed such that the magnetization directions of the pin layers thereof are perpendicular to each other,
the magnetoresistive element of the first detection unit outputs the first signal, the magnetoresistive element of the second detection unit outputs the second signal,
the calculation circuit calculates the tangential value by performing division of the first signal by the second signal,
wherein the second magnetic field that is to be parallel to the magnetization direction of the pin layer of the second detection unit is defined as an ideal second magnetic field, and the first magnetic field that is to be parallel to the magnetization direction of the pin layer of the first detection unit is defined as an ideal first magnetic field,
wherein the signal processing unit includes a storage section that stores an angle α defined between the ideal second magnetic field and the second magnetic field, and an angle β defined between the ideal first magnetic field and the first magnetic field,
wherein an angle defined between the ideal second magnetic field and the synthetic magnetic field is defined as θ', and a value that is obtained by performing division of the first signal by the second signal is defined as tan θ', and
wherein the calculation circuit calculates tan θ as the tangential value using the angle α and the angle β stored in the storage section and based on a formula of:

$$\tan\theta = \frac{\tan\theta' \cdot \cos\alpha - \sin\alpha}{\tan\theta' \cdot \sin\beta + \cos\beta}.$$

16. A current sensor for detecting an electric current flowing in a current path, the electric current generating a first magnetic field, the current sensor comprising:
a magnetic field generating element generating a second magnetic field perpendicular to the first magnetic field;
a magnetic sensor including a magnetoresistive element, the magnetoresistive element including a pin layer, a tunnel layer and a free layer, the pin layer having a fixed magnetization direction, the tunnel layer being provided by an insulating member and being disposed between the pin layer and the free layer, the free layer having a property where a magnetization direction changes according to an external magnetic field, the magnetic sensor generating at least one of a first signal containing a sine value according to an angle defined between the second magnetic field and a synthetic magnetic field composed of the first magnetic field and the second magnetic field and a second signal containing a cosine value according to the angle defined between the second magnetic field and the synthetic magnetic field; and
a signal processing unit receiving the at least one of the first signal and the second signal, the signal processing unit including a calculation circuit, wherein the calculation circuit calculates a tangential value according to the angle defined between the second magnetic field and the synthetic magnetic field using the at least one of the first signal and the second signal, and outputs a sensor signal containing the tangential value, wherein the magnetic sensor includes a first detection unit and a second detection unit, each of the first detection unit and the second detection unit includes the magnetoresistive element, the magnetoresistive element of the first detection unit and the magnetoresistive element of the second detection unit are disposed such that the magnetization directions of the pin layers thereof are perpendicular to each other, the magnetoresistive element of the first detection unit outputs the first signal, the magnetoresistive element of the second detection unit outputs the second signal, the calculation circuit calculates the tangential value by performing division of the first signal by the second signal, wherein the second magnetic field that is to be parallel to the magnetization direction of the pin layer of the second detection unit is defined as an ideal second magnetic field, wherein the signal processing unit includes a storage section that stores an angle α defined between the ideal second magnetic field and the second magnetic field, wherein an angle defined between the ideal second magnetic field and the synthetic magnetic field is defined as θ', and a value that is obtained by performing division of the first signal by the second signal is defined as tan θ', and wherein the calculation circuit calculates tan θ as the tangential value using the angle α stored in the storage section and based on a formula of:

$$\tan\theta = \tan\theta' \cdot \cos\alpha - \sin\alpha.$$

17. A current sensor for detecting an electric current flowing in a current path, the electric current generating a first magnetic field, the current sensor comprising:

a magnetic field generating element generating a second magnetic field perpendicular to the first magnetic field;

a magnetic sensor including a magnetoresistive element, the magnetoresistive element including a pin layer, a tunnel layer and a free layer, the pin layer having a fixed magnetization direction, the tunnel layer being provided by an insulating member and being disposed between the pin layer and the free layer, the free layer having a property where a magnetization direction changes according to an external magnetic field, the magnetic sensor generating at least one of a first signal containing a sine value according to an angle defined between the second magnetic field and a synthetic magnetic field composed of the first magnetic field and the second magnetic field and a second signal containing a cosine value according to the angle defined between the second magnetic field and the synthetic magnetic field; and a signal processing unit receiving the at least one of the first signal and the second signal, the signal processing unit including a calculation circuit, wherein the calculation circuit calculates a tangential value according to the angle defined between the second magnetic field and the synthetic magnetic field using the at least one of the first signal and the second signal, and outputs a sensor signal containing the tangential value, wherein the magnetic sensor includes a first detection unit and a second detection unit, each of the first detection unit and the second detection unit includes the magnetoresistive element, the magnetoresistive element of the first detection unit and the magnetoresistive element of the second detection unit are disposed such that the magnetization directions of the pin layers thereof are perpendicular to each other, the magnetoresistive element of the first detection unit outputs the first signal, the magnetoresistive element of the second detection unit outputs the second signal, the calculation circuit calculates the tangential value by performing division of the first signal by the second signal, wherein the first magnetic field that is to be parallel to the magnetization direction of the pin layer of the first detection unit is defined as an ideal first magnetic field, wherein the signal processing unit includes a storage section that stores an angle β defined between the ideal first magnetic field and the first magnetic field, wherein an angle defined between the ideal second magnetic field and the synthetic magnetic field is defined as θ', and a value that is obtained by performing division of the first signal by the second signal is defined as tan θ', and wherein the calculation circuit calculates tan θ as the tangential value using the angle β stored in the storage section and based on a formula of:

$$\tan\theta = \frac{\tan\theta'}{\tan\theta' \cdot \sin\beta + \cos\beta}.$$

18. A current sensor for detecting an electric current flowing in a current path, the electric current generating a first magnetic field, the current sensor comprising:

a magnetic field generating element generating a second magnetic field perpendicular to the first magnetic field;

a magnetic sensor including a magnetoresistive element, the magnetoresistive element including a pin layer, a tunnel layer and a free layer, the pin layer having a fixed magnetization direction, the tunnel layer being provided by an insulating member and being disposed between the pin layer and the free layer, the free layer having a property where a magnetization direction changes according to an external magnetic field, the magnetic sensor generating at least one of a first signal containing a sine value according to an angle defined between the second magnetic field and a synthetic magnetic field composed of the first magnetic field and the second magnetic field and a second signal containing a cosine value according to the angle defined between the second magnetic field and the synthetic magnetic field; and a signal processing unit receiving the at least one of the first signal and the second signal, the signal processing unit including a calculation circuit, wherein the calculation circuit calculates a tangential value according to the angle defined between the second magnetic field and the synthetic magnetic field using the at least one of the first signal and the second signal, and outputs a sensor signal containing the tangential value, the magnetic sensor is one of a plurality of magnetic sensors, and the magnetic sensors are configured such that a magnitude of the second magnetic field applied to each of the magnetic sensors is different.

19. The current sensor according to claim 18, wherein
the magnetic sensors are configured such that a distance between the magnetic field generating element and each of the magnetic sensors is different.

20. The current sensor according to claim 18, wherein the magnetic field generating element is one of a plurality of magnetic field generating elements, each generating the second magnetic field having a different magnitude.

21. The current sensor according to claim 18, wherein
the magnetic sensors are two magnetic sensors,
the calculation circuit calculates two tangential values using the at least one of the first signal and the second signal outputted from each of the two magnetic sensors,
the calculation circuit adds a predetermined offset to one of the tangential values, the one of the tangential values being calculated using the at least one of the first signal and the second signal outputted from one of the two magnetic sensors that is applied with a smaller second magnetic field than the other of the two magnetic sensors, and
the calculation circuit compares the tangential value to which the predetermined offset is added and the other of the two tangential values, and outputs one having a smaller absolute value.

22. An attachment structure comprising:
a current path through which an electric current flows, the electric current generating a first magnetic field; and
a current sensor for detecting the electric current of the current path, the current sensor including:
   a magnetic field generating element generating a second magnetic field perpendicular to the first magnetic field;
   a magnetic sensor including a magnetoresistive element, the magnetoresistive element including a pin layer, a tunnel layer and a free layer, the pin layer having a fixed magnetization direction, the tunnel layer being provided by an insulating member and being disposed between the pin layer and the free layer, the free layer having a property where a magnetization direction varies according to an external magnetic field, the magnetic sensor generating at least one of a first signal containing a sine value according to an angle defined between the second magnetic field and a synthetic magnetic field composed of the first magnetic field and the second magnetic field and a second signal containing a cosine value according to the angle defined between the second magnetic field and the synthetic magnetic field; and
   a signal processing unit receiving the at least one of the first signal and the second signal, the signal processing unit including a calculation circuit, wherein the calculation circuit calculates a tangential value according to the angle defined between the second magnetic field and the synthetic magnetic field using the at least one of the first signal and the second signal to calculate the first magnetic field/the second magnetic field, and outputs a sensor signal containing the tangential value and the sensor signal is linearly proportional to the first magnetic field,
wherein the current sensor is attached to the current path such that a direction of the second magnetic field is parallel to a direction of the electric current flowing in the current path.

* * * * *